(12) United States Patent
Newby et al.

(10) Patent No.: US 10,664,978 B2
(45) Date of Patent: May 26, 2020

(54) METHODS, SYSTEMS, AND COMPUTER READABLE MEDIA FOR USING SYNTHETICALLY TRAINED DEEP NEURAL NETWORKS FOR AUTOMATED TRACKING OF PARTICLES IN DIVERSE VIDEO MICROSCOPY DATA SETS

(71) Applicant: The University of North Carolina at Chapel Hill, Chapel Hill, NC (US)

(72) Inventors: Jay Mack Newby, Carrboro, NC (US); M. Gregory Forest, Chapel Hill, NC (US); Samuel Kit Bunn Lai, Carrboro, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 0 days.

(21) Appl. No.: 16/379,466

(22) Filed: Apr. 9, 2019

(65) Prior Publication Data

US 2019/0311482 A1    Oct. 10, 2019

Related U.S. Application Data

(60) Provisional application No. 62/655,006, filed on Apr. 9, 2018.

(51) Int. Cl.
*G06T 7/20*     (2017.01)
*G06N 3/08*     (2006.01)
(Continued)

(52) U.S. Cl.
CPC .............. *G06T 7/20* (2013.01); *G02B 21/365* (2013.01); *G06F 17/5009* (2013.01); *G06N 3/08* (2013.01);
(Continued)

(58) Field of Classification Search
None
See application file for complete search history.

(56) References Cited

U.S. PATENT DOCUMENTS

| 6,473,698 B1 * | 10/2002 | Albert ................. A61B 5/0261 702/19 |
| 2014/0367260 A1 * | 12/2014 | Dickerson .............. B03C 5/005 204/547 |

(Continued)

FOREIGN PATENT DOCUMENTS

WO    WO-2018015414 A1 *    1/2018    ........... G06N 3/0445

OTHER PUBLICATIONS

Schaefer, A.—"Deep neural networks automate detection for tracking of submicron scale particles in 2D and 3D"—arXiv—Apr. 10, 2017—pp. 1-14 (Year: 2017).*

(Continued)

*Primary Examiner* — Bernard Krasnic
(74) *Attorney, Agent, or Firm* — Jenkins, Wilson, Taylor & Hunt, P.A.

(57) ABSTRACT

A method for using a synthetically trained neural network for tracking particle movement in video microscopy data includes receiving, as input, video microscopy data representing images of particles that move between video frames. The method includes using a synthetically trained neural network to track movement of the particles between the video frames, wherein the synthetically trained neural network comprises a neural network that is trained on a plurality of different simulated video microscopy data sets. The method further includes outputting, by the synthetically trained neural network, an indication of movement of the particles between the video frames.

13 Claims, 15 Drawing Sheets

(51) Int. Cl.
G06N 20/00 (2019.01)
G06F 17/50 (2006.01)
G02B 21/36 (2006.01)
(52) U.S. Cl.
CPC .... G06N 20/00 (2019.01); *G06T 2207/10016* (2013.01); *G06T 2207/10056* (2013.01); *G06T 2207/20081* (2013.01); *G06T 2207/20084* (2013.01)

(56) References Cited

U.S. PATENT DOCUMENTS

2018/0365842 A1* 12/2018 Bozorgtabar ......... G06T 7/0016
2019/0065818 A1* 2/2019 Lee ..................... G06K 9/0014
2019/0143326 A1* 5/2019 Irimia ................ G01N 33/5091

OTHER PUBLICATIONS

Wang et al., "Influenza-binding antibodies immobilize influenza viruses in fresh human ariway mucus," European Respiratory Journal, vol. 49, pp. 1-4 (2017).
Xiao et al., "Automatic optimal filament segmentation with sub-pixel accuracy using generalized linear models and B-spline level-sets," Medical Image Analysis, vol. 32, pp. 157-172 (Aug. 2016).
Vasquez et al., "Entropy gives rise to topologically associating domains," Nucleic Acids Res., vol. 44, No. 12, pp. 5540-5549 (Jun. 2, 2016).
Josephson et al., "Particle tracking microrheology of protein solutions," Journal of Rheology, vol. 60, No. 4, pp. 531-540 (May 2016).
Long et al., "Fully Convolutional Networks for Semantic Segmentation," 2015 IEEE Conference on Computer Vision and Pattern Recognition (CVPR), pp. 3431-3440 (2015).
Nunn et al., "Enhanced Trapping of HIV-1 by Human Cervicovaginal Mucus is Associated with Lactobacillus crispatus—Dominant Microbiota," mBio, vol. 6, No. 5, e01084-15, pp. 1-9 (Sep./Oct. 2015).
Wang et al., "IgG in cerviovaginal mucus traps HSV and prevents vaginal Herpes infections," Mucosal Immunology, vol. 7, No. 5, pp. 1036-1044 (Sep. 2014).
Chenouard et al., "Objective comparison of particle tracking methods," Nature Methods, vol. 11, No. 3, pp. 281-289 (Mar. 2014).
Chenouard et al., "Multiple Hypothesis Tracking for Cluttered Biological Image Sequences," IEEE Transactions on Pattern Analysis and Machine Intelligence, vol. 35, No. 11, pp. 2736-2750 (Nov. 2013).
Krizhevsky et al., "ImageNet Classification with Deep Convolutional Neural Networks," Advances in Neural Information Processing Systems, pp. 1097-1105 (2012).
Schultz et al., "Microrheology of biomaterial hydrogelators," Soft Matter, vol. 8, No. 23, pp. 6198-6205 (2012).
Parthasarathy, "Rapid, accurate particle tracking by calculation of radial symmetry centers," Nature Methods, vol. 9, No. 7, pp. 724-726 (Jul. 2012).
Glorot et al., "Deep Sparse Rectifier Neural Networks," Proceedings of the 14th International Conference on Artificial Intelligence and Statistics (AISTATS), vol. 15, pp. 315-323 (2011).
Flores-Rodriguez et al., "Roles of Dynein and Dynactin in Early Endosome Dynamics Revealed Using Automated Tracking and Global Analysis," vol. 6, No. 9, e24479, pp. 1-11 (Sep. 2011).
Yang et al., "Biodegradable Nanoparticles Composed Entirely of Safe Materials that Rapidly Penetrate Human Mucus," Angewandte Chemie International Edition, vol. 50, No. 11, pp. 2597-2600 (Mar. 7, 2011).
Lai et al., "Nanoparticles reveal that human cervicovaginal mucus is riddled with pores larger than viruses," Proc Natl Acad Sci, vol. 107, No. 2, pp. 598-603 (Jan. 12, 2010).
Wirtz, "Particle-Tracking Microrheology of Living Cells: Principles and Applications," Annual Review of Biophysics, vol. 38, pp. 301-326 (2009).
Lai et al., "Micro- and macrorheology of mucus," Advanced Drug Delivery Reviews, vol. 61, No. 2, pp. 86-100 (Feb. 27, 2009).
Jaqaman et al., "Robust single particle tracking in live cell time-lapse sequences," Nature Methods, vol. 5, No. 8, pp. 695-702 (Aug. 2008).
Lai et al., "Rapid transport of large polymeric nanoparticles in fresh undiluted human mucus," Proc. Natl. Acad. Sci., vol. 104, No. 5, pp. 1482-1487 (Jan. 30, 2007).
Waigh et al., "Microrheology of complex fluids," Reports on Progress in Physics, vol. 68, No. 3, pp. 685-742 (Feb. 9, 2005).
Savin et al., "Static and Dynamic Errors in Particle Tracking Microrheology," Biophysical Journal, vol. 88, pp. 623-638 (Jan. 2005).
Wong et al., "Anomalous Diffusion Probes Microstructure Dynamics of Entangled F-Actin Networks," Physical Review Letters, vol. 92, No. 17, pp. 178101-1-178101-4 (Apr. 2004).
Chen et al., "Rheological Microscopy: Local Mechanical Properties from Microrheology," Physical Review Letters, vol. 90, No. 10, pp. 108301-1-108301-4 (Mar. 2003).
Olivo-Marin, "Extraction of spots in biological images using multiscale products," Pattern Recognition, vol. 35, No. 9, pp. 1989-1996 (2002).
Valentine et al., "Investigating the microenvironments of inhomogeneous soft materials with multiple particle tracking," Physical Review E, vol. 64, No. 6, pp. 061506-1-061506-9 (2001).
Mason et al., "Particle Tracking Microrheology of Complex Fluids," Physical Review Letters, vol. 79, No. 17, pp. 3282-3285 (Oct. 27, 1997).
Crocker et al., "Methods of Digital Video Microscopy for Colloidal Studies," Journal of Colloid and Interface Science, vol. 179, pp. 298-310 (1996).
Lumia, "A New Three-Dimensional Connected Components Algorithm," Computer Vision, Graphics, and Image Processing, vol. 23, No. 2, pp. 207-217 (1983).

* cited by examiner

INTER-USER VARIATIONS IN PARTICLE TRACES

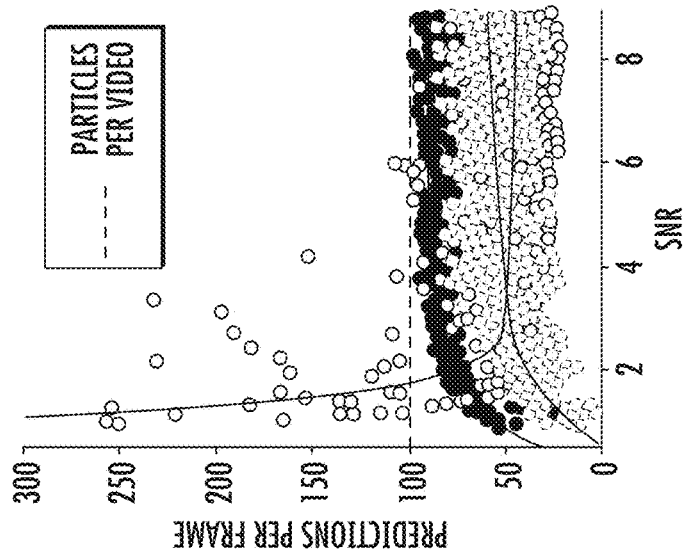
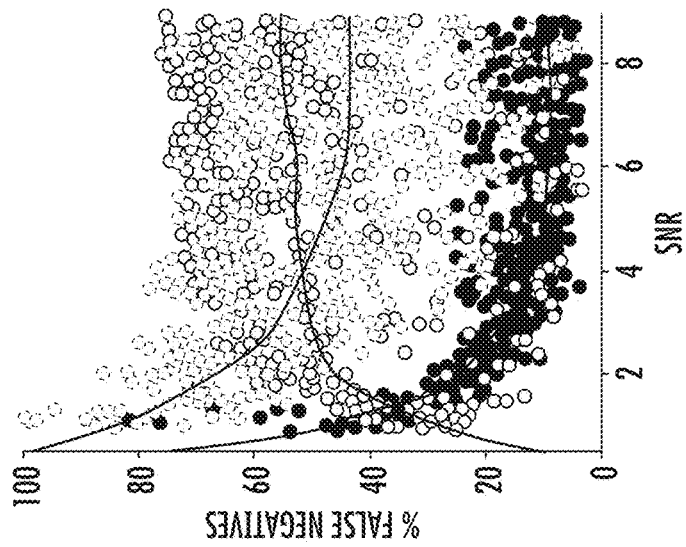
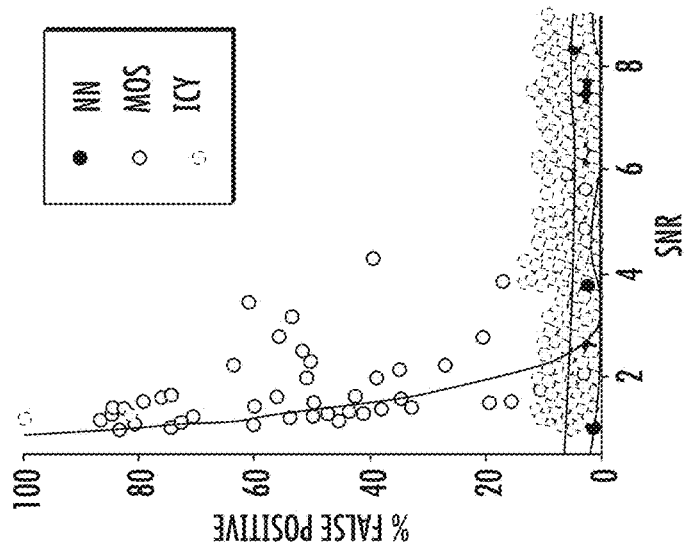
FIG. 4A
FIG. 4B
FIG. 4C

|    | PARTICLE | FRAME | x        | y          |
|----|----------|-------|----------|------------|
| 0  | 0        | 0     | 1.427460 | 265.209791 |
| 1  | 0        | 1     | 1.461142 | 265.138675 |
| 2  | 0        | 2     | 1.460442 | 265.146003 |
| 3  | 0        | 3     | 1.465795 | 265.125572 |
| 4  | 0        | 4     | 1.462314 | 265.137897 |
| 5  | 0        | 5     | 1.450823 | 265.136422 |
| 6  | 0        | 6     | 1.443916 | 265.127110 |
| 7  | 0        | 7     | 1.455005 | 265.152628 |
| 8  | 0        | 8     | 1.469306 | 265.151765 |
| 9  | 0        | 9     | 1.474887 | 265.158441 |
| 10 | 0        | 10    | 1.476507 | 265.151820 |
| 11 | 0        | 11    | 1.476116 | 265.148877 |
| 12 | 0        | 12    | 1.475918 | 265.146176 |
| 13 | 0        | 13    | 1.467146 | 265.139533 |
| 14 | 0        | 14    | 1.478265 | 265.145415 |
| 15 | 0        | 15    | 1.484714 | 265.129870 |
| 16 | 0        | 16    | 1.499703 | 265.142278 |
| 17 | 0        | 17    | 1.508751 | 265.133009 |
| 18 | 0        | 18    | 1.516462 | 265.119523 |
| 19 | 0        | 19    | 1.505729 | 265.143822 |
| 20 | 1        | 0     | 1.675566 | 508.881756 |
| 21 | 1        | 1     | 1.718451 | 508.841092 |
| 22 | 1        | 2     | 1.706672 | 508.877445 |
| 23 | 1        | 3     | 1.682133 | 508.902490 |
| 24 | 1        | 4     | 1.654963 | 508.912730 |
| 25 | 1        | 5     | 1.656674 | 508.900416 |
| 26 | 1        | 6     | 1.678539 | 508.877046 |
| 27 | 1        | 7     | 1.726471 | 508.873137 |
| 28 | 1        | 8     | 1.761771 | 508.831698 |

FIG. 10

METHODS, SYSTEMS, AND COMPUTER READABLE MEDIA FOR USING SYNTHETICALLY TRAINED DEEP NEURAL NETWORKS FOR AUTOMATED TRACKING OF PARTICLES IN DIVERSE VIDEO MICROSCOPY DATA SETS

PRIORITY CLAIM

This application claims the benefit of U.S. Provisional Patent Application No. 62/655,006 filed Apr. 9, 2018, the disclosure of which is incorporated herein by reference in its entirety.

GOVERNMENT INTEREST

This invention was made with government support under Grant No. DMR-1151477 awarded by the National Science Foundation. The government has certain rights in the invention.

TECHNICAL FIELD

The subject matter described herein relates to tracking particles in video microscopy data. More particularly, the subject matter described herein relates to using synthetically trained deep neural networks for automated tracking of particles in diverse video microscopy data sets.

BACKGROUND

Particle tracking in video microscopy involves tracking particle movement over time in video microscopy frames. Software is available for semi-automated tracking of particles across video microscopy frames. However, existing software must be manually tuned for video microscopy imaging and experimental conditions, such as background lighting, particle size, noise, and particle diffusivity, associated with each video microscopy data set. Such conditions vary across video microscopy data sets. As a result, human intervention and expertise are required to tune or configure the software for optimal particle tracking in each individual video microscopy dataset. Due to the variations in imaging and experimental conditions across different video microscopy data sets and the need to manually tune tracking software for each individual set of conditions, existing tracking software is sub-optimal for automated tracking across different video microscopy datasets. In addition, because human intervention is required to configure the tracking software for each analysis, tracking results are not reproducible.

Accordingly, in light of these difficulties, there exists a need for improved methods, systems, and computer readable media for automated tracking of particles in diverse video microscopy data sets.

SUMMARY

The subject matter described herein relates to methods, systems, and computer readable media for automated tracking of particles in diverse video microscopy data sets. One method includes receiving, as input, video microscopy data representing images of particles that move between video frames. The method includes using a synthetically trained neural network to track movement of the particles between the video frames, wherein the synthetically trained neural network comprises a neural network that is trained on a plurality of different simulated video microscopy data sets. The method further includes outputting, by the synthetically trained neural network, an indication of movement of the particles between the video frames.

A system for using a synthetically trained neural network for tracking particle movement in video microscopy data includes a computing platform having at least one processor. The system further includes a synthetically trained neural network executable by the at least one processor for receiving, as input, video microscopy data representing images of particles that move between video frames, tracking movement of the particles between the video frames, wherein the synthetically trained neural network comprises a neural network that is trained on a plurality of different simulated video microscopy data sets, and outputting, an indication of movement of the particles between the video frames.

As used herein, the term "particle" refers to any living or non-living object that it is desirable to track changes in position across time in video microscopy data. The term "video microscopy data" refers to data corresponding to image frames captured at different times by an image capture device through a lens of a microscope. The term "video microscopy data set" refers to video microscopy data collected for a given experiment. The term "simulated video microscopy data set" refers to a video microscopy data generated by a computer simulation of a video microscopy environment and particles moving within the video microscopy environment.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

(FIG. 2A) average frames per particle;

(FIG. 2B) ensemble-averaged geometric mean square displacements (<MSD>) vs. time scale. Error bars represent standard error of the mean. * indicates statistically significant difference compared to 'Standard' (p<0:05). (FIGS. 2C-2E) Inter-user variations in particle tracking. Different tracking software users were asked to analyze the same video of 200 nm bead in human cervicovaginal mucus. (FIG. 2A) Total particles tracked; (FIG. 2B) average frames tracked per particle; and (FIG. 2C) ensemble-averaged geometric mean square displacements (<MSD>) at a time scale ($\tau$) of 1 s.

FIGS. 4A-4I illustrate sensitivity analysis for randomized 2D synthetic test videos. (FIGS. 4A-4C) 2D test results showing the (FIG. 4A) percentage of false positives, (FIG. 4B) percentage of false negatives and (FIG. 4C) predictions per frame vs. SNR. Mosaic shows a sharp rise in false positives for SNR<2 (panel A), due to substantially more predictions than actual particles (panel C). Conversely, the neural net (NN) and Icy showed no increase in false positives at low SNR. (FIGS. 4D-4E) results showing the (FIG. 4D) percentage of false positives, (FIG. 4E) percentage of false negatives and (FIG. 4F) localization error vs. the PSF radius. (FIGS. 4G-4I) results showing the (FIG. 4G) percentage of false positives, (FIG. 4H) path duration, and (FIG. 4F) measured diffusivity vs. the ground truth particle diffusivity.

(FIG. 6C) alpha value (FIG. 6D) percentage of false positives normalized by path-length (FIG. 6E) number of particles tracked (FIG. 6F) average path duration per particle. The error bars in (FIG. 6C) represent standard error of the mean. The box plot in (FIG. 6D) shows symbols for the outliers above the 80th percentile of observations. The data set includes 20 different movies encompassing muco-inert 200 nm PEGylated polystyrene beads 200 nm carboxylated beads, HIV virus-like particles and herpes simplex virus in human cervicovaginal mucus.

FIG. 10 is a table illustrating exemplary position time series data that may be generated by a synthetically trained neural network.

DETAILED DESCRIPTION

Particle tracking is a powerful biophysical tool that requires conversion of large video files into position time series, i.e. traces of the species of interest for data analysis. Current tracking methods, based on a limited set of input parameters to identify bright objects, are ill-equipped to handle the spectrum of spatiotemporal heterogeneity and poor signal-to-noise ratios typically presented by submicron species in complex biological environments. Extensive user involvement is frequently necessary to optimize and execute tracking methods, which is not only inefficient but introduces user bias. To develop a fully automated tracking algorithm, we developed a convolutional neural network comprised of over 50,000 parameters and employed deep learning to train the network on a diverse portfolio of video conditions. The neural network tracker, with no user-dependent input parameters, offered superior tracking performance, with exceptionally low lower false positive and false negative rates on both 2D and 3D simulated videos and 2D experimental videos of difficult-to-track species.

Introduction

In particle tracking experiments, high-fidelity tracking of an ensemble of species recorded by high-resolution video microscopy can reveal critical information about species transport within cells or mechanical and structural properties of the surrounding environment. For instance, particle tracking has been extensively used to measure the real-time penetration of pathogens across physiological barriers [1-3], to facilitate the development of nanoparticle systems for transmucosal drug delivery [4, 5], to explore dynamics and organization of domains of chromosomal DNA in the nucleus of living cells [6], and to characterize the micro- and meso-scale rheology of complex fluids via engineered probes [7-17]. The extraction of individual traces from raw videos is generally divided into two steps: (i) identifying the precise locations of particle centers from each frame of the video, and (ii) linking these particle centers across sequential frames into tracks or paths. There has been significant progress towards the goal of fully automated tracking, and dozens of methods are currently available that can automatically process videos, given a predefined set of adjustable parameters [18, 19]. Nonetheless, when presented with videos containing spatiotemporal heterogeneity (see FIG. 1) such as variable background intensity, photobleaching or low signal-to-noise ratio, the set of parameters used by a given method must be optimized for each set of video conditions, or even each video, which is highly subjective in the absence of ground truth.

Figure 2A:
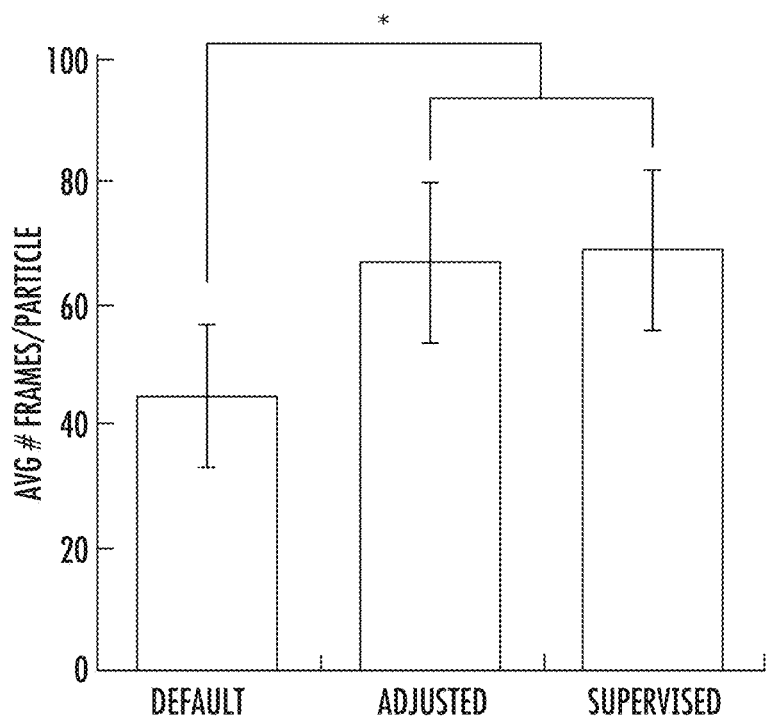
FIGS. 2A-2E include graphs illustrating the need for supervision in particle tracking, and inter-user variations in supervised tracking data. Data represents the average of 4 movies of muco-inert 200 nm PEGylated polystyrene beads in human cervicovaginal mucus. Data from human supervised tracking (Supervised), which includes manually inspecting paths to remove false positives and minimize false negatives, is compared to results generated under default conditions of the tracking software (Default) and conditions manually adjusted by the user (Adj) to improve tracking accuracy.
Figure 2B:
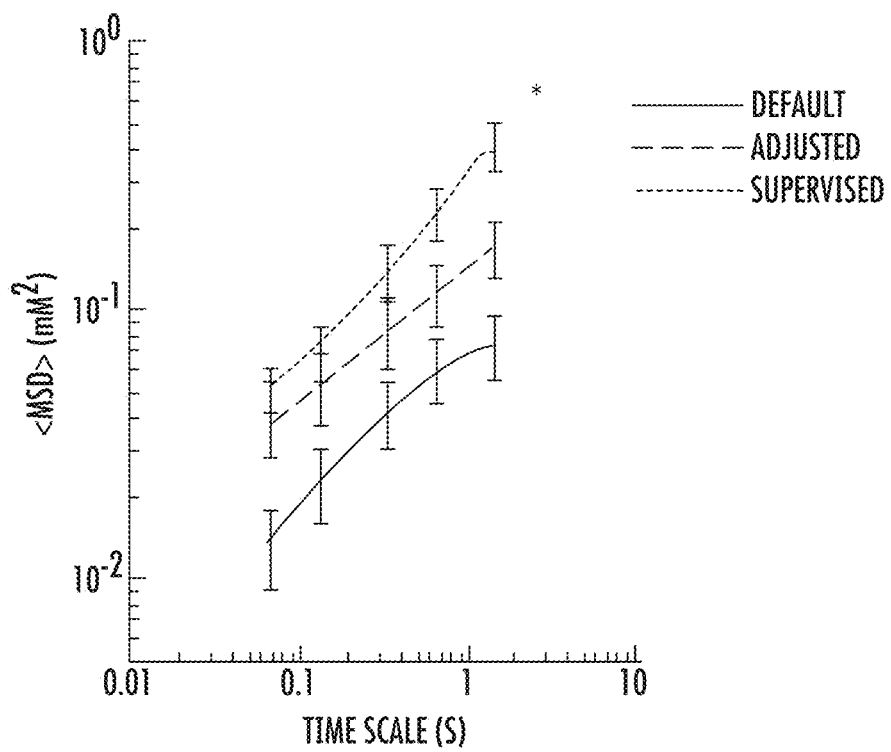
Figure 2E:
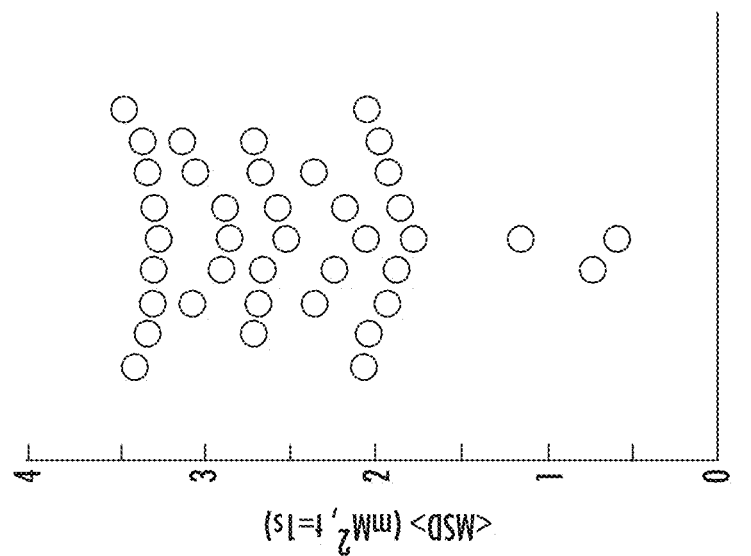
Figure 2D:
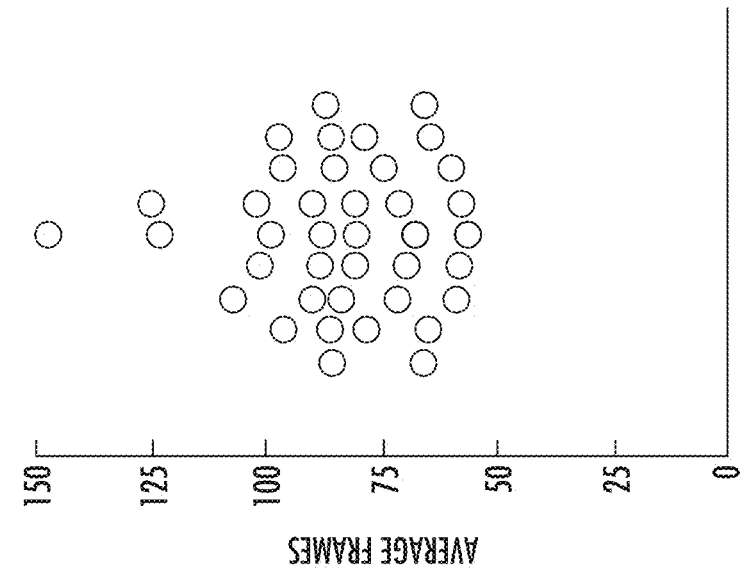
Figure 2C:
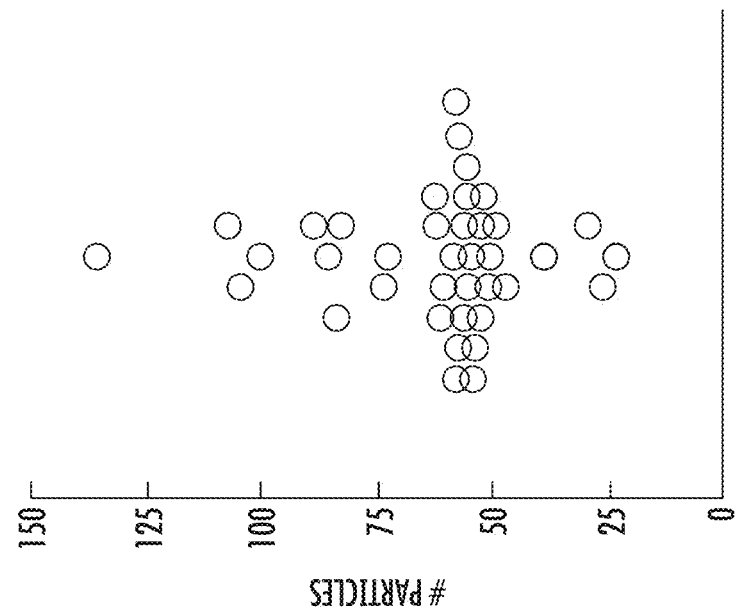

Parameter optimization is time consuming and requires substantial user guidance. Furthermore, when applied to experimental videos, user input is still frequently needed to remove phantom traces (false positives) or add missing traces (false negatives) (FIGS. 2A-2B). Thus, instead of providing full automation, current software is perhaps better characterized as facilitating supervised particle tracking, requiring substantial human interaction that is time consuming and costly. More importantly, the results can be highly variable, even for the same input video (FIGS. 2C-2E).

During the 2012 IEEE International Symposium on Biomedical Imaging, an open competition was held to develop and compare different particle tracking techniques [19]. One of the main outcomes of the study was the recommended process for optimizing particle tracking methods to experimental data. Specifically, the authors proposed to first generate simulated videos that match as closely as possible to the observed experimental conditions. Second, a tracking method suitable for those conditions is selected and applied to the simulated videos, and the error is quantitatively assessed. Third, the parameters in the tracking method are optimized to minimize the tracking error. Finally, once the parameters have been optimized to minimize tracking error on simulated data, the same parameters are used to analyze experimental videos.

To overcome the need to optimize for each video condition, we take the aforementioned methodology to the next logical step: instead of optimizing a tracking algorithm for a specific microscopy conditions, we compile a large portfolio of simulations that encompasses the full spectrum of potential variations that can be encountered in particle tracking experiments. Existing methods are designed with as few parameters as possible to make the software simple to use for humans, and a single set of parameters can usually be found for a specific microscopy conditions (SNR, size, shape, etc.) that identifies objects of interest. Nevertheless, a limited parameter space compromises the ability to optimize the method for an entire portfolio. An alternative approach is to construct an algorithm with thousands of parameters, and employ machine learning to optimize the algorithm to perform well under all conditions represented in the portfolio. Here, we introduce an artificial neural network algorithm—called a convolutional neural network (CNN)—comprised on a 3-layer architecture and over 50,000 tunable parameters. A CNN is a type of feed-forward artificial neural network designed to process information in a layered network of connections. In recent years, CNNs have become the state-of-the-art for object recognition in computer vision [20, 21]. All of the neural network's tunable parameters are optimized using machine learning, which means there are never any parameters that the user needs to adjust for particle localization. The result is a highly optimized network that can perform under a wide range of conditions without any user supervision.

Figure 1:
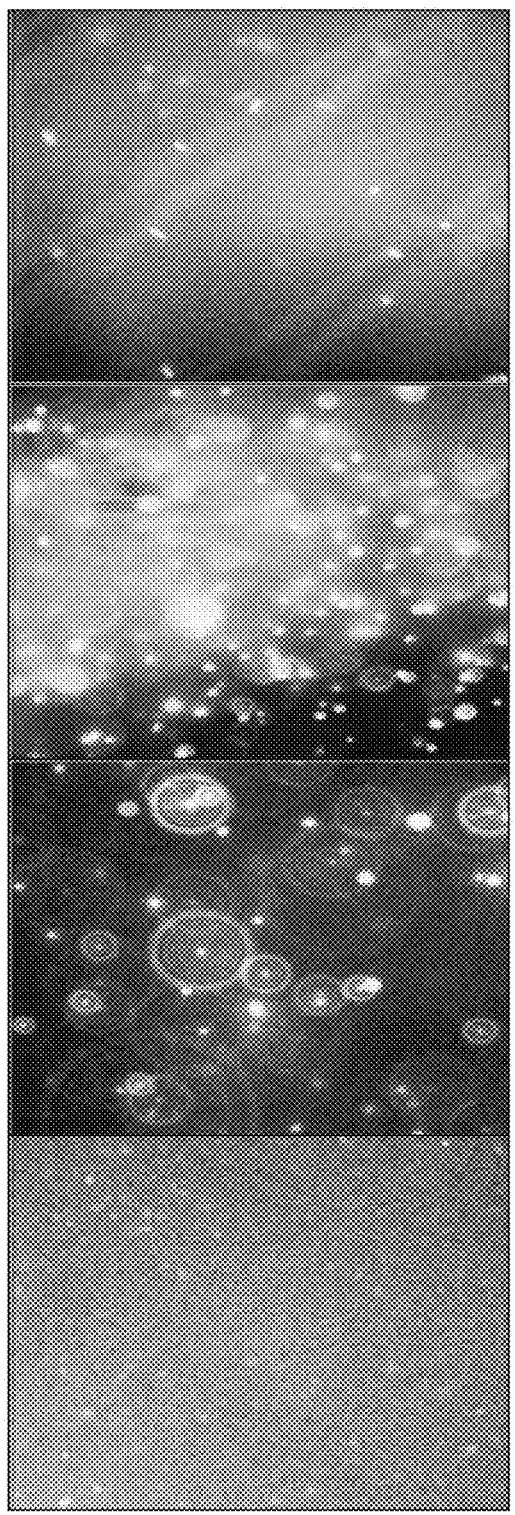
FIG. 1 illustrates sample frames from experimental videos, highlighting some of the challenging conditions for particle tracking. (from left to right) 50 nm particles captured at low signal to noise ratio (SNR), 200 nm particles with diffraction disc patterns, variable background intensity, and ellipsoid point spread function (PSF) shapes from 1-2 µm Salmonella.

To demonstrate accuracy, we test the neural network tracker on a large set of challenging videos that span a wide range of conditions, including variable background, particle motion, particle size, and low SNR Simulation of 4D Greyscale Image Data To train the network on a wide range of video conditions, we developed new video simulation software that accounts for a large range of conditions found in particle tracking videos (see FIG. 1). The primary advance is to include simulations of how particles moving in 3D appear in a 2D image slice captured by the camera. A standard camera produces images that are typically single channel (grey scale), and the image data is collected into four dimensional (three space and one time dimension) arrays of 16 bit integers. The resolution in the (x; y) plane is dictated by the camera and can be in the megapixel range. The resolution in the z coordinate is much smaller since each slice requires a piezo-electric motor to move the lens relative to the sample. A good piezo-electric motor is capable of moving between slices within a few milliseconds, which means that there is a trade off between more z-slices and the over all frame rate. For particle tracking, a typical video includes 10-50 z-slices per volume. The length of the video refers to the number of time points, i.e., the number of volumes collected. Video length is often limited by photobleaching, which slowly lowers the SNR as the video progresses.

To simulate a particle tracking video, we must first specify how particles appear in an image. The pixel intensities captured by a microscope and camera resulting from a particle centered at a given position (x; y; z) is called a point spread function (PSF), denoted by $\psi_{ijk}(x; y; z)$, where i; j; k are the pixel indices. The PSF becomes dimmer and less focused as the particle moves away from the plane of focus (z=0). Away from the plane of focus, the PSF also develops disc patterns caused by diffraction, which can be worsened by spherical aberration. While deconvolution can mitigate the disc patterns appearing in the PSF, the precise shape of the PSF must be known or unpredictable artifacts may be introduced into the image.

The shape of the PSF depends on several parameters that vary depending on the microscope and camera, including emitted light wavelength, numerical aperture, pixel size, and the separation between z-axis slices. It is not practical for the purpose of automatic particle tracking to develop a physical model based on optical physics that exposes these parameters. In practice, there are many additional factors that affect the PSF, such as the refractive index of the glass slide, of the lens oil (if oil-immersion objective is used), and of the medium containing the particles being imaged. The latter presents the greatest difficulty since biological specimens are often heterogeneous, and their optical properties are difficult to predict. The PSF can also be affected by particle velocity, depending on the duration of the exposure interval used by the camera. This makes machine learning particularly appealing, because we can simply randomize the shape of the PSF to cover a wide range of conditions, and the resulting CNN is capable of automatically 'deconvolving' PSFs without the need to know any of the aforementioned parameters.

Low SNR is an additional challenge for tracking of submicron size particles. High performance digital cameras are used to record images at a sufficiently high frame rate to resolve statistical features of particle motion. Particles with a hydrodynamic radius in the range of 10-100 nm move quickly, requiring a small exposure time to minimize dynamic localization error (motion blur) [22]. Smaller particles also emit less light for the camera to collect. To train the neural network to perform in these conditions, we add Poisson shot noise with random intensity to the training videos. We also add slowly varying random background patterns (see FIG. 7).

An Artificial Neural Network for Particle Localization

The 'neurons' of the artificial neural network are arranged in layers, which operate on multi-dimensional arrays of data. Each layer output is 3 dimensional, with 2 spatial dimensions and an additional 'feature' dimension (see FIG. 3). Each feature within a layer is tuned to respond to specific patterns, and the ensemble of features is sampled as input to the next layer to form features that recognize more complex patterns. For example, the lowest layer is comprised of features that detect edges of varying orientation, and the second layer features are tuned to recognize curved lines and circular shapes (see FIG. 3). Each neuron in the network processes information from spatially local inputs (either pixels of the input image or lower layer neurons). This enables a neuron to, figuratively speaking, see a local patch of the input image, which is smaller than the entire input image. The size of the image patch that affects the input to a given neuron is called its receptive field. The input and output, denoted by $I_{ij}$ and $O_{ij}$, relationship for each neuron is given by $$O_{ij} = F\left(\sum_{i',j'} w_{i',j'} I_{i+i',j+j'} - b\right), \quad (1)$$

where the kernel weights $w_{ij}$ and output bias b are trainable parameters. Each layer has its own set of biases, one for each feature, and each feature has its own set of kernel weights, one for each feature in the layer directly below. The non-linearity $F(\bullet)$ is a pre-specified function that determines the degree of 'activation' or output, we use $F(u)=\log(e^u+1)$. Inserting nonlinearity in between each layer of neurons is necessary for CNNs to approximate nonlinear functions. The most common choice is called the rectified linear unit ($F(u \geq 0)=u$ and $F(u<0)=0$). Instead, we use a function with a similar shape that is also continuously differentiable, which helps minimize training iterations where the model is stuck in local minima [23].

The neural network is comprised of three layers; 12 features in layer one, 32 features in layer two, and the final two output features in layer three. The output of the neural net, denoted by $q_{ijk}$, can be interpreted as the probability of a particle centered at pixel (i, j, k). We refer to these as detection probabilities.

While it is possible to construct a network that takes 3D image data as input, it is not computationally efficient. Instead, the network is designed to process a single 2D image slice at a time (so that it can also be applied to the large set of existing 2D imaging data) while still maintaining the ability to perform 3D tracking. Constructing 3D output $q_{ijk}$ is achieved by applying the network to each z-axis slice of the input image, the same way a microscope obtains 3D images by sequentially capturing each z-axis slice. Two or three dimensional paths can then be reconstructed from the network output as described below.

Advanced image classification tasks take color images as input. Most commonly, RGB images are used, which have three color channels: red, green, and blue. CNNs designed for image classification use all three channels as input to the first layer. Since microscopy videos are typically greyscale data, we replaced color channels with adjacent video frames. The neural net is comprised of three adjacent image frames so that each inference is obtained using information from the past and future to improve accuracy. Because detections include information from the past and future, the detection probabilities are reduced when a particle is not detected in the previous frame (the particle just appeared in the current frame) or is not detected in the following frame (the particle is about to leave the plane of focus). Below, we show how the detection probabilities can be used by the linking algorithm to improve its performance.

Optimizing Neural Network Parameters with Machine Learning

The values of the trainable parameters in the network, including the kernel weights and biases, are optimized through the process of learning. Using known physical models of particle motion and imaging, we simulate random particle paths and image frames that cover a wide range of conditions, including particle point spread function shape, variable background, particle number, particle mobility, and SNR. The 'ground truth' for each image consists of a binary image with pixels values $p_{ijk}=1$ if $\|(j, i, k)-x_n\|<2$ and $p_{ijk}=0$ otherwise. Each training image is processed by the neural net, and the corresponding output is compared to the ground truth using the cross entropy error:

$$H[p,q] = -\frac{1}{N}\sum_{ijk}[p_{ijk}\log q_{ijk} + (1-p_{ijk})\log(1-q_{ijk})], \quad (2)$$

where N is the total number of pixels in the image. Cross entropy is (up to an additive constant that depends on p) a measure of how far the approximated distribution q is from the true distribution p. When q=p, the cross entropy reduces to the entropy of the true distribution p. Since p never changes for a given training video, our goal is to minimize H[p,q] with respect to q over the entire training set of videos. At each iteration of the training procedure, a randomly generated training image is processed by the network, the error H[p,q] is computed, and all of the trainable parameters are altered by a small amount (using the gradient decent method explained below) to reduce the observed error. This training procedure is repeated thousands of times until the error is minimized.

Suppose that all of the trainable parameters are arranged into the vector θ. The parameters are adjusted at the end of each training iteration t by computing the gradient of $g_t = \nabla_\theta H[p_t, q_t]$. The gradient vector points in the direction of steepest rate of increase in the error, so the error can be reduced with $\theta_{t+1} = \theta_t - r g_t$, where r>0 is a predefined step size.

Generation of training images was performed in Python and training of the neural network was performed using Google's open source software package, Tensorflow. After training, the neural network is also deployed within Tensorflow, which executes the most computationally costly elements of the neural net tracker in highly optimized C++ code. Tensorflow can be easily adapted to use multiple cores of a CPU or GPU, depending on available hardware. On a standard desktop CPU with 4 cores, the neural net processes 512×512 resolution frames at ~5 frames per second.

Particle Path Linking

From the neural net output, we extract candidate particles along with their probabilities through thresholding the detection probabilities $p_{ijk}$, where ijk are the indices for each pixel of a single video frame. Detection probabilities for which $p_{ijk}<0.5$ are eliminated. The remaining pixels contain local maxima $\rho_n$, which are extracted and identified as candidate particles using the method of connected components [24]. Connected sets of nearest neighbor pixels $P_n$ above the threshold are collected as candidate particles. That is, $P_n$ is a connected set and $p_{ijk} \geq 0.5$ for all $p_{ijk} \in P_n$. Each candidate particle is assigned the largest pixel probability from its constituent pixel probabilities, i.e., $\rho_n = \max P_n$. The position of each candidate particle is taken to be the center of mass given by, $$x_n = \frac{\sum_{p_{ijk} \in \mathcal{P}_n} (j, i, k) p_{ijk}}{\sum_{p_{ijk} \in \mathcal{P}_n} p_{ijk}}. \quad (3)$$

Note that there are alternative particle localization methods [25] that may increase accuracy. We have found that the center of mass method yields consistent sub-pixel accuracy of 0.6 pixels on average, which is sufficient for tracking tasks that require high accuracy such as microrheology. The next stage is to link candidate particles from one frame to the next.

The dynamics of particle motion can vary depending on the properties of the surrounding fluid and the presence of active forces (e.g., flagellar mediated swimming of bacteria and molecular motor cargo transport). In order to reconstruct accurate paths from a wide range of movement characteristics, we develop a minimal model that assumes only that particles move within a Gaussian range from one frame to the next. To accurately capture continuous motion sampled at discrete time intervals, dictated by the camera frame rate, the particle motion must be sufficiently small between image frames. Let $L_t$ denote the set of linked particle pairs $(x_t; x_{t+1})$ together with their probabilities $(\rho_t, \rho_{t+1})$ in frame t to t+1. Let $N_t^\pm$ be the set of probabilities for particles in frame t that are not linked to a particle in frame t±1. Then, the log likelihood cost of the link assignments from frame t to frame t+1 is given by $$L_t = -\sum_{x_t, x_{t+1} \in \mathcal{L}_t} \frac{\|x_t - x_{t+1}\|^2}{2\sigma^2} + \sum_{\rho_t, \rho_{t+1} \in \mathcal{L}_t} [\log \rho_t + \log \rho_{t+1}] - \sum_{\rho_t \in N_t^+} \log(1 - \rho_t) - \sum_{\rho_{t+1} \in N_{t+1}^-} \log(1 - \rho_{t+1}). \quad (4)$$

The standard deviation a is a user-specified parameter. Maximization of (4) can be formulated as a linear programming problem, which we solve using the Hungarian-Munkres algorithm [26].

Performance Evaluation and Comparison to Existing Software

We consider the primary goal for a high fidelity tracker to be accuracy (i.e., minimize false positives and localization error), followed by the secondary goal of maximizing data extraction (i.e., minimize false negatives and maximize path length). We therefore adopted error estimates focused on particle identification developed in [19]. To gauge accuracy, particle positions were matched to ground truth using optimal linear assignment. The algorithm finds the closest match between tracked and ground truth particle positions that are within a preset distance of 5 pixels; this is well above the sub-pixel error threshold of 1 pixel, but sufficiently small to ensure 1-1 matching. Tracked particles that did not match any ground truth particles were deemed false positives, and ground truth particles that did not match a tracked particle were deemed false negatives. To assess the performance of the neural net tracker, we analyzed the same videos using three different leading tracking software packages that are publicly available:

Mosaic (Mos): an ImageJ plug-in capable of automated tracking in 2D and 3D [27]

Icy: an open source bio-imaging platform with preinstalled plugins capable of automated tracking in 2D and 3D [28, 29]

Video Spot Tracker (VST): a stand-alone application developed by the Center for Computer-Integrated Systems for Microscopy and Manipulation at UNC-CH capable of 2D particle tracking. VST also has a convenient graphic user interface that allows a user to add or eliminate paths (because human-assisted tracking is time consuming, 100 2D videos were randomly selected from the 500 video set)

Performance on Simulated 2D Videos

Because manual tracking by humans is subjective, our first standard for evaluating the performance of the neural net tracker (NN) and other publicly available software is to follow the recommended protocol set out in [19] and test on simulated videos, for which the ground truth particle paths are known. The test included 500 2D videos and 50 3D videos, generated using the video simulation methodology described in Section. Each 2D video contained 100 simulated particle paths for 50 frames at 512×512 resolution, (see FIG. 7). Each 3D video contained 20 evenly spaced z axis image slices of a 512×512×120 pixel region containing 300 particles. The conditions for each video were randomized, including variable background intensity, PSF radius (called particle radius for convenience), diffusivity, and SNR.

Figures 4D, 4E, 4F:
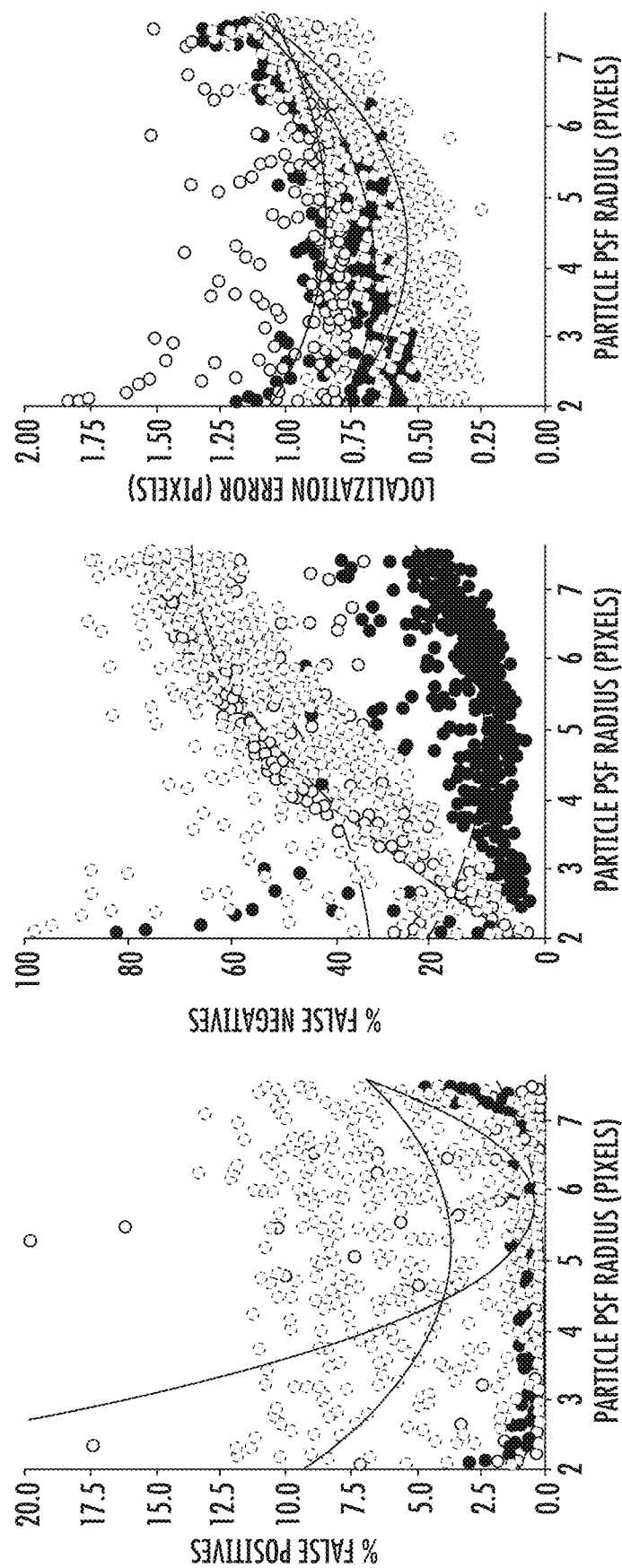

To assess the robustness of each tracking method/software, we used the same set of tracker parameters for all videos (see section below entitled Parameter Values for Tracking Software used in Synthetic Video Tests for further details). Scatter plots of the 2D test video results for neural network tracker, Mosaic, and Icy are shown in FIGS. 4A-4I. For Mosaic, the false positive rate was generally quite low (~2%) when SNR>3, but showed a marked increase to >20% for SNR<3 (FIG. 4A). The average false negative rates were in excess of 50% across most SNR>3 (FIG. 4B). In comparison, Icy possessed higher false positive rates than Mosaic at high SNR and lower false positive rates when SNR is decreased below 2.5, with a consistent ~5% false positive rate across all SNR values (FIG. 4A). The false negative rates for Icy was greater than Mosaic at high SNR, and exceeded ~40% for all SNR tested (FIG. 4B).

All three methods showed some minor sensitivity in the false positive rate and localization error to the PSF radius (FIGS. 4D, 4F). (Note that the high sensitivity Mosaic displayed to changes in SNR made the trend for PSF radius difficult to discern.) Mosaic and Icy showed much higher sensitivity in the false negative rate to PSF radius, each extracting nearly 4-fold more particles as the PSF radius decreased from 8 to 2 pixels (FIG. 4E).

When estimating diffusivities, Icy exhibited increased false positive rates with faster moving particles (FIG. 4G), likely due to the linker compensating for errors made by detection algorithm. In other words, while the linker was able to correctly connect less-mobile particles without confusing them with nearby false detections, when the diffusivity rose, the particle displacements tended to be larger than the distance to the nearest false detection. This also caused Icy to underestimate the diffusivity (FIG. 4I) when D>2.

Figure 4I:
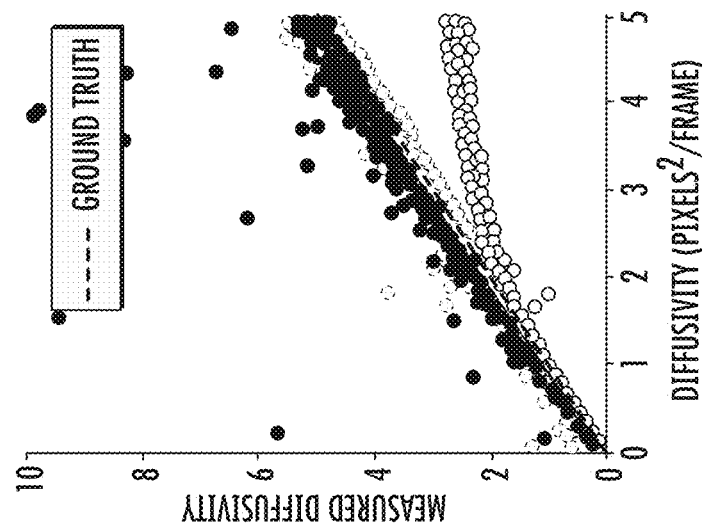
Figure 4H:
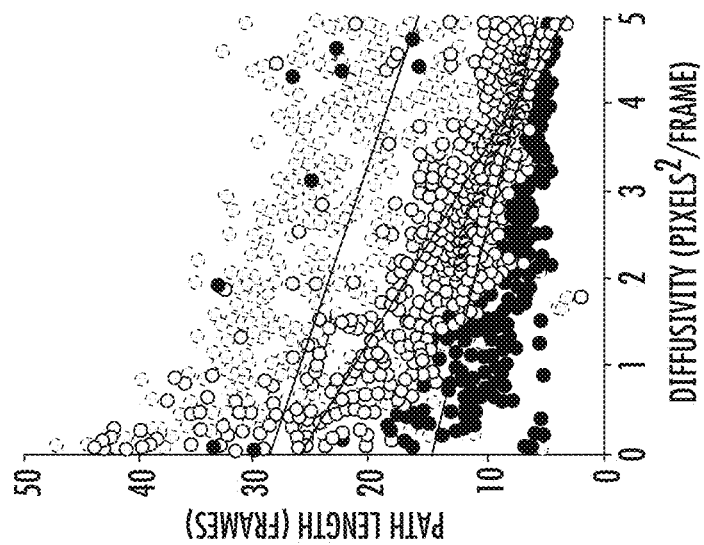
Figure 4G:
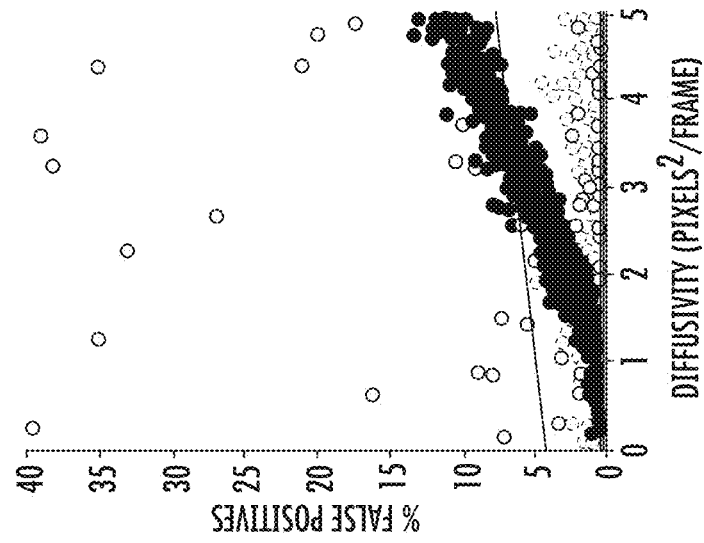

In contrast to Mosaic and Icy, the neural network tracker possessed a far lower mean false positive rate of ~0.5% across all SNR values tested (FIG. 4A). The neural network tracker was able to achieve this level of accuracy while extracting a large number of paths, with <20% false negative rate for all SNR>2:5 and only a modest increase in the false negative rate at lower SNR (FIG. 4B). Importantly, the neural network tracker performed well under low SNR conditions by making fewer predictions, and the number of predictions made per frame are generally in reasonable agreement with the theoretical maximum (FIG. 4C). Since the neural network was trained to recognize a wide range of PSFs, it also maintained excellent performance (<1% false positive, <20% false negative) across the range of PSF radius (FIG. 4E). The neural network tracker possessed comparably good localization error as Mosaic and Ivy, less than one pixel on average and never more than two pixels, even though true positives were allowed to be as far as 5 pixels apart (FIG. 4F). The neural network tracker was able to accurately track and reproduce the diffusivities across a wide range of particle speeds (FIGS. 4G-4I).

Performance on Simulated 3D Videos

Figure 5A:
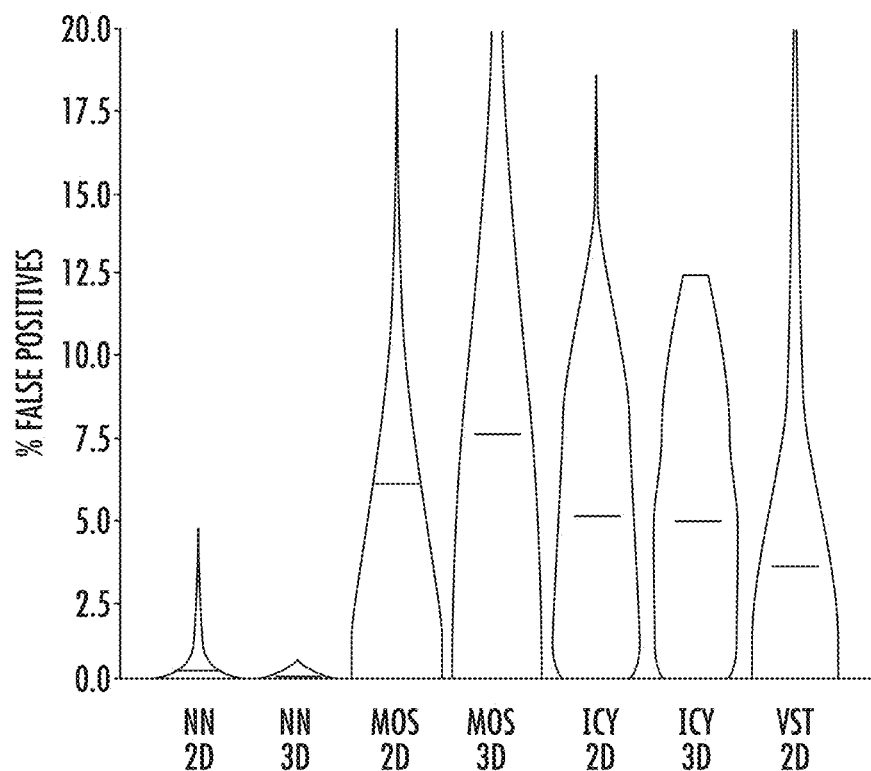
FIGS. 5A-5D illustrate violin plots showing the performance on 3D test videos for each of the four methods: the neural network tracker (NN), Mosaic (Mos), Icy, and VST. Performance with 2D simulated videos are included for comparison. The solid black lines show the mean, and the thickness of the filled regions show the shape of the histogram obtained from 500 (50) randomized 2D (3D) test videos. Note that the VST results only included 100 test videos.
Figure 5B:
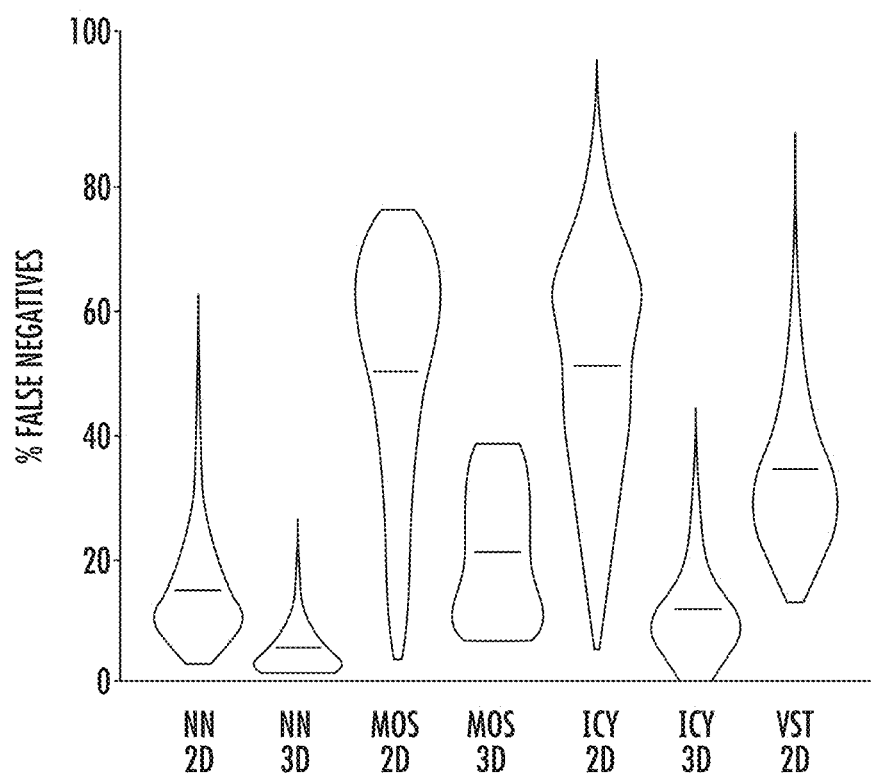
Figure 5C:
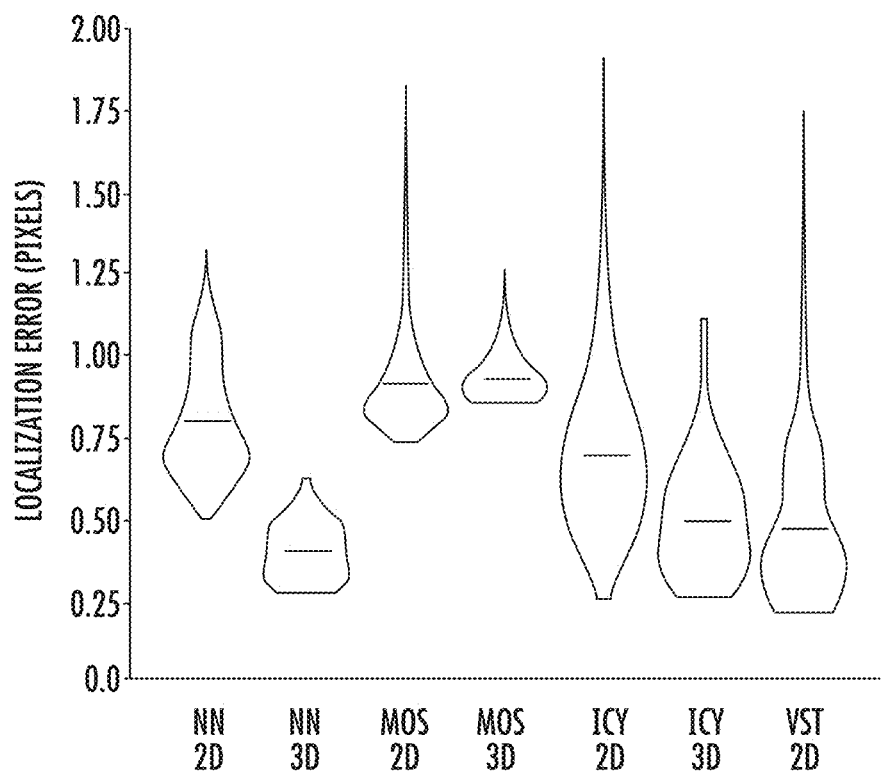
Figure 5D:
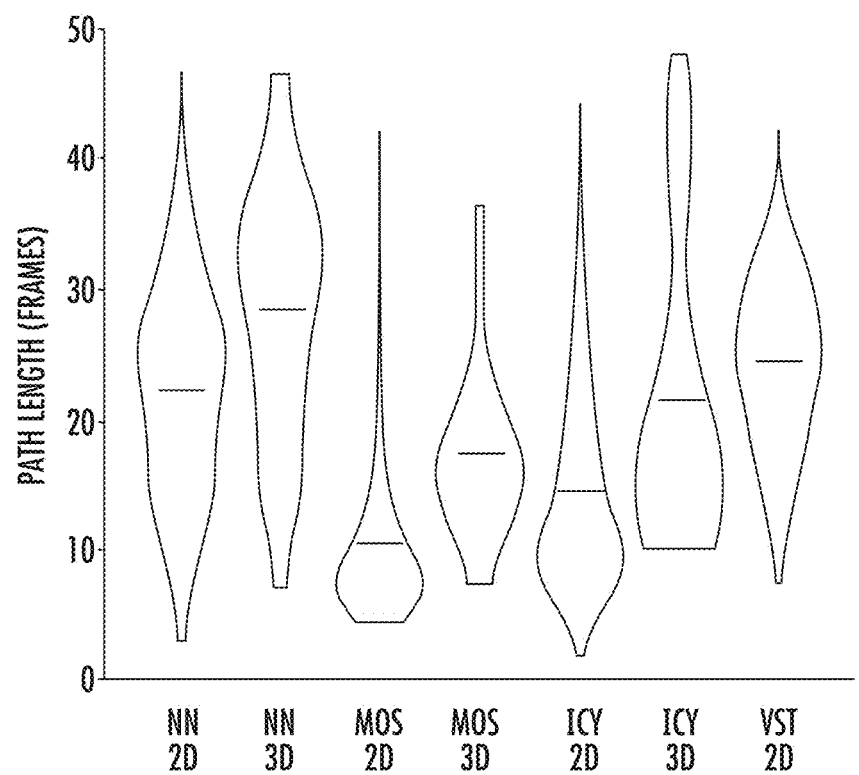
Figure 6C:
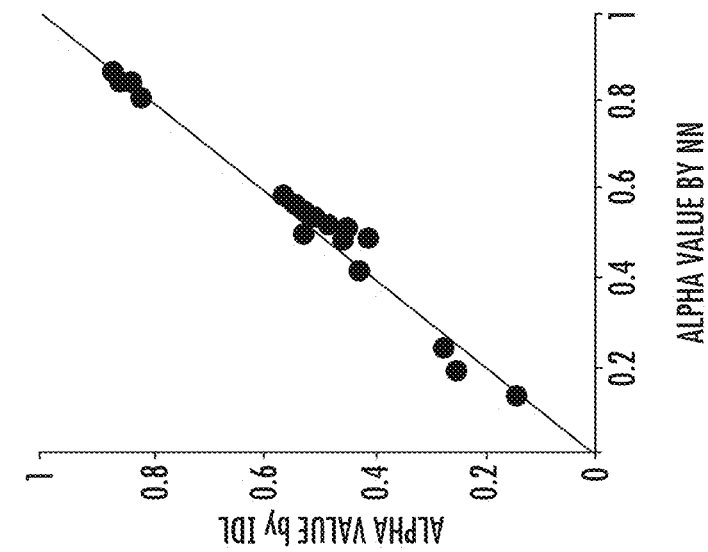
FIGS. 6A-6F illustrate a comparison of human tracked (assisted by the commercially available software package IDL) and neural network tracked output. Ensemble-averaged geometric mean square displacements (<MSD>) at a time scale ($\tau$) of (FIG. 6A) 0:267 s and (FIG. 6B) 1 s.
Figure 6B:
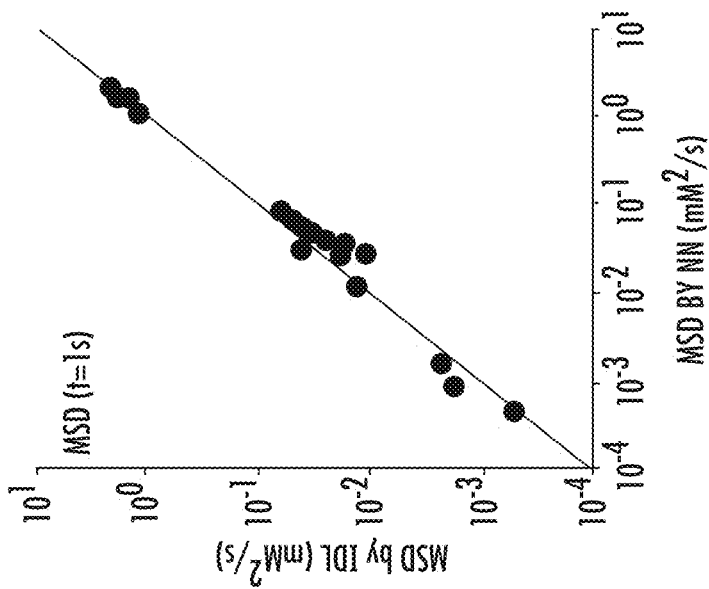
Figure 6A:
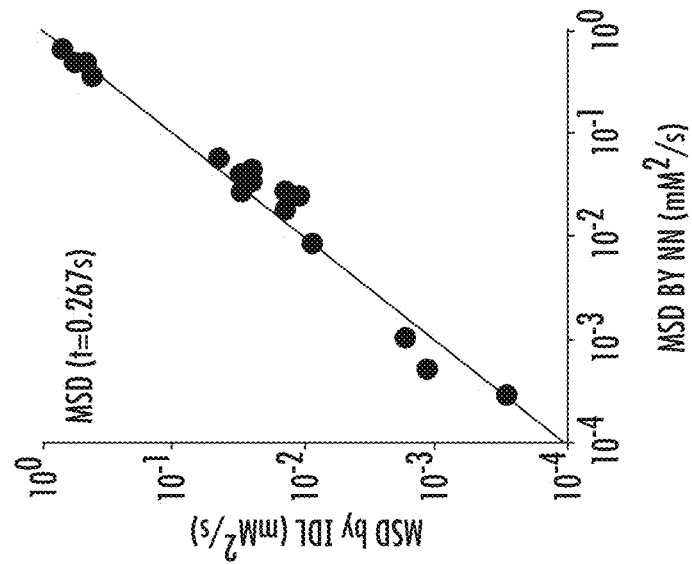
Figure 6F:
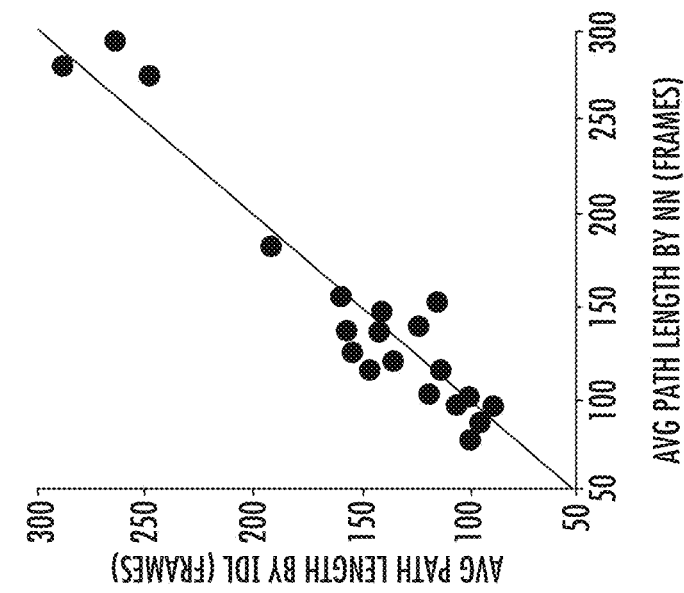
Figure 6E:
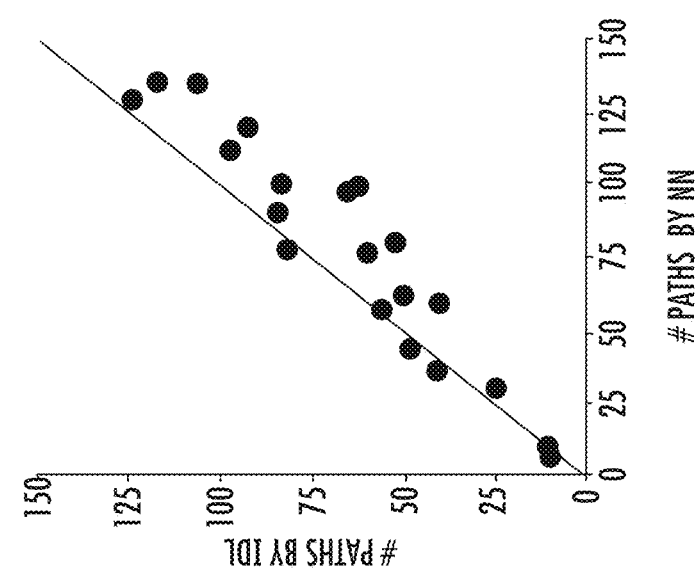
Figure 6D:
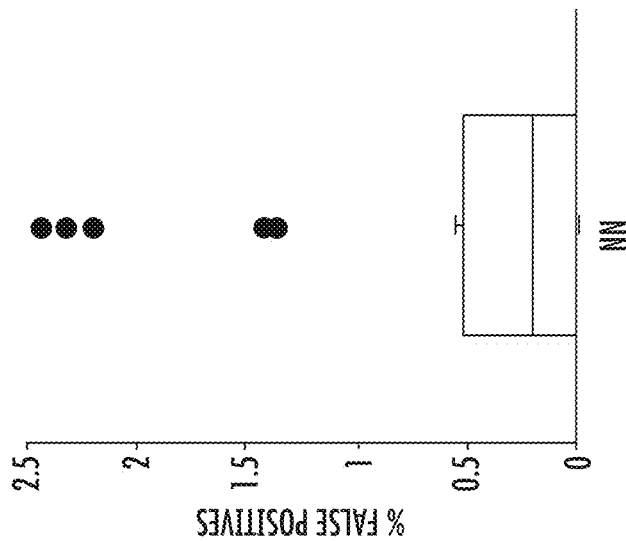

When analyzing 3D videos, Mosaic and Icy were able to maintain roughly comparable false positive rates (~5-8%) as analyzing 2D videos (FIG. 5A). Surprisingly, analyzing 3D videos with the neural network tracker resulted in an even lower false positive rate than 2D videos, with ~0.2% false positives. All three methods capable of 3D tracking exhibited substantial improvements in reducing false negatives, reducing localization error, and increasing path duration (see FIGS. 5B-5D). Strikingly, the neural network was able to correctly identify an average of ~95% of the simulated particles in a 3D video, i.e. <5% false negatives, with the lowest localization error as well as the longest average path duration among the three methods.

Performance on Experimental 2D Videos

Finally, we sought to evaluate the performance and rigor of the neural network tracker on experimentally-derived rather than simulated videos, since the former can include spatiotemporal variations and features that might not be captured in simulated videos. Because analysis from the particle traces can directly influence interpretations of important biological phenomenon, the common practice is for the end-user to supervise and visually inspect all traces to eliminate false positives and minimize false negatives. Against such rigorously verified tracking, the neural net tracker was able to produce particle paths with comparable mean squared displacements across different time scales, alpha values, a low false positive rate, greater number of traces i.e. decrease in false negative, and comparable path length (see FIGS. 6A-6F). Most importantly, these videos were processed in less than one twentieth of the time it took to manually verify them, generally taking 30-60 seconds to process a video compared to 10-20 minutes to verify accuracy.

Discussion

Although tracking the motion of large, bright, micron sized beads is straightforward, it remains exceptionally difficult to rapidly and accurately obtain traces of entities, such as ultrafine nanoparticles and viruses, that are sub-micron in size. Sub-micron particles can readily diffuse in and out of the plane of focus, possess low SNR or significant spatial heterogeneity, and undergo appreciable photobleaching over the timescale of imaging. Accurate conversion of videos to particle paths for these entities necessitates extensive human intervention; it is not surprising to spend 10-20x more time on extracting path data from videos than the actual video acquisition time. Worse, substantial user variations is common even when using the same software to analyze the same videos (FIGS. 2A-2E). Analysis throughput is further limited by the fact that students/users can rarely process more than 10-20 videos per day without encountering 'tracker fatigue' that hinders their decision making. These challenges have strongly limited particle tracking, preventing it from becoming a widely-used tool in physical and life sciences.

To tackle these challenges, we developed here a CNN comprised of over 50,000 parameters, and employed deep learning to optimize the network against a diverse array of video conditions. The end product is a fully automated tracker can consistently analyze both 2D and 3D videos with a remarkably low false positive rate, and lower false negative rate, lower localization error and longer average path lengths than a number of the leading particle tracking software. Importantly, because the tracker requires no user input, the output is absolute and reproducible, which not only improves the rigor and reproducibility of all particle tracking experiments within a lab but also enable different labs across the world to compare particle tracking data in an objective manner. Finally, the neural network tracker greatly increases the throughput of converting videos into particle position time series, which addresses in our opinion the biggest bottleneck limiting the applications of particle tracking.

CNN has become the state-of-the-art for object recognition in computer vision, outperforming other methods for many imaging tasks. A number of research groups are beginning to apply machine learning to object identification and tracking, primarily involving 'hand crafted' features that in essence serve as a set of filter banks for making statistical measurements of an image, such as mean intensity, standard deviation and cross correlation. These features are used as inputs for a support vector machine, which is then trained using machine learning. The use of hand-crafted features substantially reduces the number of parameters that must be trained. In contrast, we have developed our network to be trained end-to-end, or pixels-to-pixels, so that the input is the raw imaging data, and the output is a probabilistic classification of particle versus background at every pixel, with all parameters optimized via machine learning. Importantly, we have designed our network to effectively perform convolutions in both space and time (past, present and future) to infer particle locations.

Currently, nearly all particle tracking is performed on 2D videos, despite the fact that 2D PT generally can only capture the vast majority of highly mobile particle species for exceedingly short duration. It is dangerous, and frequently incorrect, to extrapolate measurements at short timescales to make predictions of behaviors spanning long time scales. Indeed, the small number of observations of mobile species with 2D PT preclude the use of sophisticated Bayesian and Maximum Likelihood Estimators to perform model selection and get tight bounds on parameters of best-fit models, thus losing the power of prediction beyond experimental timescales. Naturally, 3D imaging can substantially improve particle tracking quality, and provide critical insights into numerous physiological phenomena that cannot be adequately captured by 2D PT. Nevertheless, visualizing 3D volumetric time series data is a significant challenge for the human eye, which is limited to perceiving 2D projections, and 3D videos contain at least 10-50 times more data than a comparable 2D video. Although software-assisted tracking is widely available for 3D videos, the excessive time needed to verify accurate tracking, coupled with data storage requirements, have prohibited most research groups from attempting 3D particle tracking, even though the technical capability to do so has existed for decades. The few groups that acquire videos in 3D generally only do so to choose the most visually optimal plane for 2D tracking analysis. By requiring no user-input, we believe the neural network tracker can tackle the longstanding challenge of analyzing 3D videos, and in the process encourage broad adoption of 3D PT for applications previously deemed inaccessible. Likewise, by enabling rapid and user-independent analysis, the neural network tracker should in theory also enable fully automated particle tracking experiments.

Parameter Values for Tracking Software Used in the Synthetic Video Tests

Figure 7:
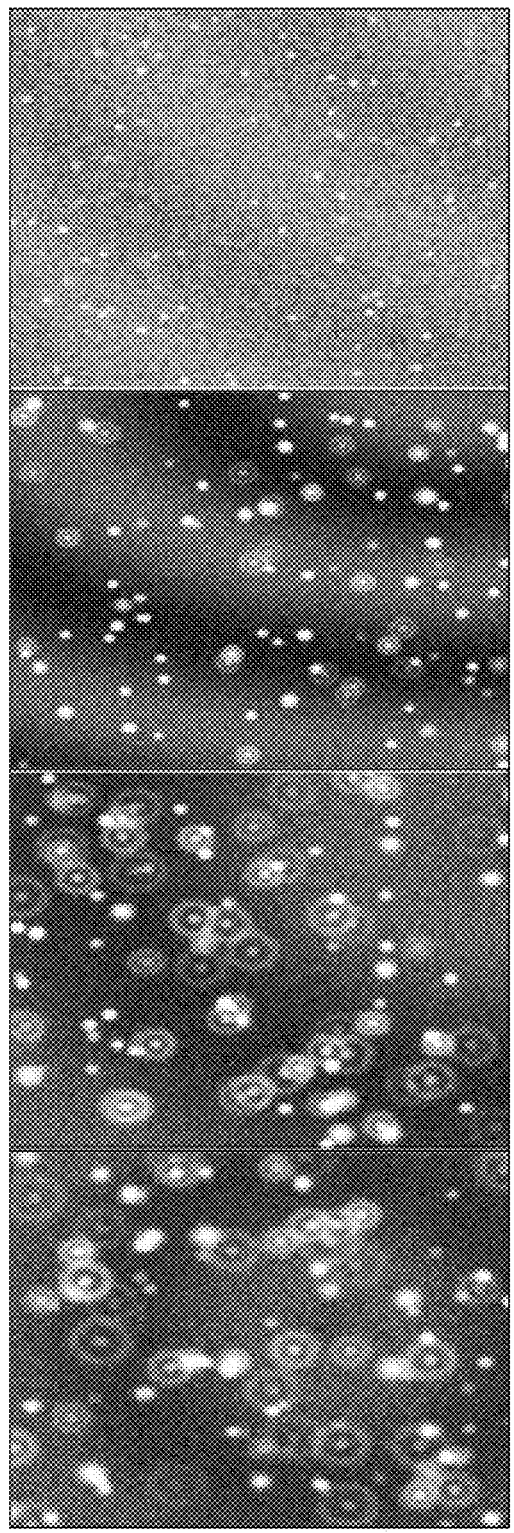
FIG. 7 is a diagram illustrating sample frames from four different synthetic test videos.

Sample frames of the synthetic test videos can be seen in FIG. 7. All of the 2D and 3D videos were tracked using the same set of parameter values. Through experimentation, these parameter values showed the best performance overall. The neural net tracker uses one parameter in its linking method (for collecting particle localizations into paths). The standard deviation for particle displacements was set to σ=20. For Mosaic, we used a custom ImageJ macro, using three parameter values, to batch process the test videos. The particle detection parameters were radius=8; cutoff=0; percentile=0:8

For ICY, we used a custom JavaScript script for batch processing, which only required parameter values for its particle localization method. The particle detection parameters were scale1=0; scale2=0; scale3=50; scale4=100

For linking, we specified that particles with PSF radius <2 (the minimum size in the test videos) be filtered, and that the ICY linker should assume all particles move by standard Brownian motion.

Figure 8:
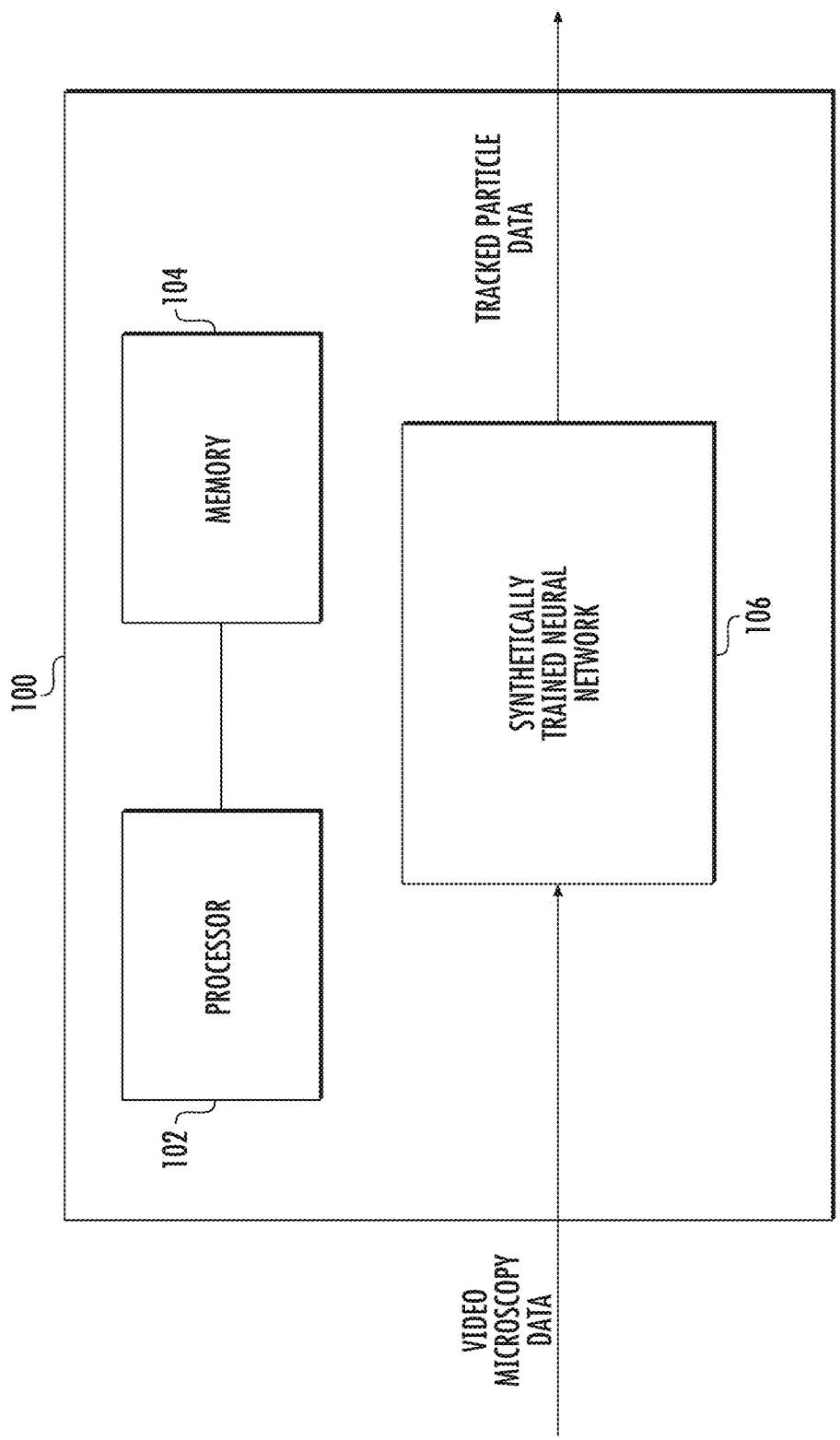
FIG. 8 is a block diagram of a system for using a synthetically trained neural network to track particles in video microscopy data.

Example Computing Platform Implementation and Process for Automated Particle Tracking in Video Microscopy Data Using Trained Neural Network FIG. 8 is a block diagram of a system for tracking particle movement in video microscopy data using a synthetically trained neural network. In FIG. 8, the system includes a computing platform 100 having at least one processor 102 and memory 104. A synthetically trained neural network 106 may reside on computing platform 100 and be executable by processor 102. Synthetically trained neural network 106 may receive video microscopy data as input and may generate tracked particle data as output. In one example, computing platform 100 with synthetically trained neural network 106 may be located in a cloud network, receive video microscopy data from an on premise network of a user, track particle movement in the video microscopy data, and provide, as output, the tracked particle movement data to the on-premise network of the user. In an alternate example, computing platform 100 with synthetically trained neural network 106 may be located in an on-premise network of a user, may track particles in video microscopy data generated by the user and may output tracked particle movement data to the user.

Figure 3:
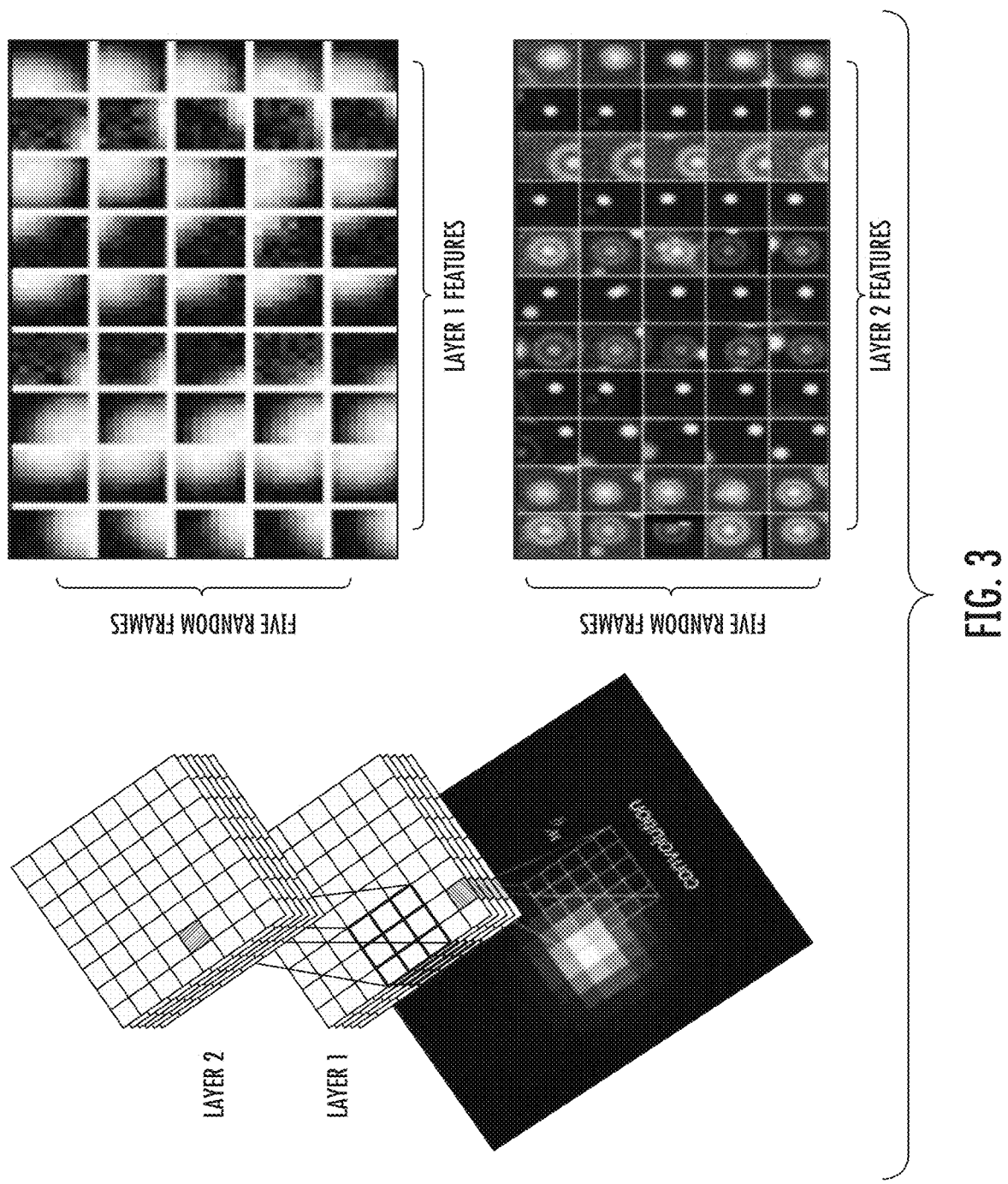
FIG. 3 illustrates a convolutional neural network. (left) Diagram of the layered connectivity of the artificial neural network. (right) Features from layer one (top) and layer two (bottom). Five random frames from a video were processed through the neural net and image patches that maximally activated a given feature were recorded. Layer one features respond maximally to edges with varying orientation. Layer two features (only a subset shown) respond maximally to varying arrangements of circular spots surrounded or not surrounded by discs.

Synthetically trained neural network 106 may be trained on simulated video microscopy data, as described above. The simulated video microscopy data used to train neural network 106 may simulate plural different video microscopy tracking conditions. The different video microscopy tracking conditions may include randomized video microscopy tracking conditions. In one example, synthetically trained neural network 106 may be a convolutional neural network, as illustrated in FIG. 3. Synthetically trained neural network 106 may track movement of the particles in at least one of x, y, and z directions, where the x and y directions are parallel to the focal plane of the microscope used to obtain the image and the z direction is perpendicular to the focal plane of the microscope.

Figure 9:
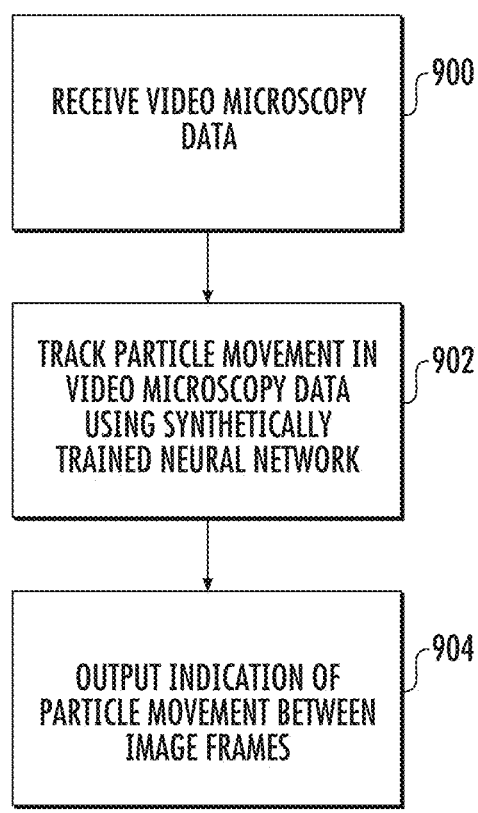
FIG. 9 is a flow chart illustrating an exemplary process for using a synthetically trained neural network to track particles in video microscopy data.

FIG. 9 illustrates an exemplary process for using a synthetically trained neural network for tracking particle movement in video microscopy data. Referring to FIG. 9, in step 900, the process includes receiving, as input, video microscopy data including images of particles that move between video frames. For example, synthetically trained neural network 106 may receive video microscopy data generated by a microscope and stored in any suitable image file format, where at least some of the same particles are present in successive image frames.

In step 902, the process includes using a synthetically trained neural network to track movement of the particles between the video image frames, where the synthetically trained neural network comprises a neural network that is trained on a plurality of different simulated video microscopy data sets. For example, synthetically trained neural network 106 may be trained using randomized simulated video microscopy parameters, such as particle PSF, SNR, background lighting, diffusivity and subsequently used to automatically track particle movement in real video microscopy data received from a lab. The synthetically trained neural network may also be trained or fine tuned from using real video microscopy data that has been segmented either manually or using tracking software other than synthetically trained neural network 106 to generate ground truth tracking data.

In step 904, the process includes outputting, by the synthetically trained neural network, an indication of movement of the particles between the video image frames. For example, synthetically trained neural network 106 may output indicates of changes in location of tracked particles in x, y, and z directions in successive video frames. In one example, the output generated by synthetically trained neural network 106 may be position time series, which may be a table that lists tracked particles by particle identifiers, locations, and corresponding times. FIG. 10 is an example of a position time series that may be generated by synthetically trained neural network 106. In FIG. 10, the x and y positions of two particles, particle 0 and particle 1 are tracked across different frames.

Because synthetically trained neural network 106 is trained using diverse synthetic video microscopy datasets, synthetically trained neural network 106 may track particle movement across diverse real video microscopy datasets with a reduced need for manual fine tuning of the tracking for each individual video micropy data sets. As a result, tracking can be automated and performed on different video microscopy data sets with increased throughput and decreased labor over conventional particle tracking methods. In addition, because synthetically trained neural network 106 operates with minimal user configuration, tracking analysis results may be more reproducible and less subjective than those produced using currently available tracking software.

REFERENCES

The disclosure of each of the following references is hereby incorporated herein by reference it its entirety.

[1] Y.-Y. Wang, A. Kannan, K. L. Nunn, M. A. Murphy, D. B. Subramani, T. Moench, R. Cone, and S. K. Lai, "Igg in cervicovaginal mucus traps hsv and prevents vaginal herpes infections," Mucosal immunology, vol. 7, no. 5, pp. 1036-1044, 2014.

[2] K. L. Nunn, Y.-Y. Wang, D. Harit, M. S. Humphrys, B. Ma, R. Cone, J. Ravel, and S. K. Lai, "Enhanced trapping of hiv-1 by human cervicovaginal mucus is associated with lactobacillus crispatus-dominant microbiota," MBio, vol. 6, no. 5, pp. e01 084-15, 2015.

[3] Y. Wang, D. Harit, D. Subramani, H. Arora, P. Kumar, and S. Lai, "Influenza-binding antibodies immobilize influenza viruses in fresh human airway mucus," European Respiratory Journal, vol. (in press), 2016.

[4] S. K. Lai, D. E. O'Hanlon, S. Harrold, S. T. Man, Y.-Y. Wang, R. Cone, and J. Hanes, "Rapid transport of large polymeric nanoparticles in fresh undiluted human mucus," Proceedings of the National Academy of Sciences, vol. 104, no. 5, pp. 1482-1487, 2007.

[5] M. Yang, S. K. Lai, Y.-Y. Wang, W. Zhong, C. Happe, M. Zhang, J. Fu, and J. Hanes, "Biodegradable nanoparticles composed entirely of safe materials that rapidly penetrate human mucus," Angewandte Chemie International Edition, vol. 50, no. 11, pp. 2597-2600, 2011.

[6] P. A. Vasquez, C. Hult, D. Adalsteinsson, J. Lawrimore, M. G. Forest, and K. Bloom, "Entropy gives rise to topologically associating domains," Nucleic acids research, p.gkw510, 2016.

[7] T. Mason, K. Ganesan, J. Van Zanten, D. Wirtz, and S. C. Kuo, "Particle tracking microrheology of complex fluids," Physical Review Letters, vol. 79, no. 17, p. 3282, 1997.

[8] D. Wirtz, "Particle-tracking microrheology of living cells: principles and applications," Annual review of biophysics, vol. 38, pp. 301-326, 2009.

[9] D. Chen, E. Weeks, J. C. Crocker, M. Islam, R. Verma, J. Gruber, A. Levine, T. C. Lubensky, and A. Yodh, "Rheological microscopy: local mechanical properties from microrheology," Physical review letters, vol. 90, no. 10, p. 108301, 2003.

[10] I. Wong, M. Gardel, D. Reichman, E. R. Weeks, M. Valentine, A. Bausch, and D. Weitz, "Anomalous diffusion probes microstructure dynamics of entangled factin networks," Physical review letters, vol. 92, no. 17, p. 178101, 2004.

[11] T. A. Waigh, "Microrheology of complex fluids," Reports on Progress in Physics, vol. 68, no. 3, p. 685, 2005.

[12] N. Flores-Rodriguez, S. S. Rogers, D. A. Kenwright, T. A. Waigh, P. G. Woodman, and V. J. Allan, "Roles of dynein and dynactin in early endosome dynamics revealed using automated tracking and global analysis," PloS one, vol. 6, no. 9, p. e24479, 2011.

[13] K. M. Schultz and E. M. Furst, "Microrheology of biomaterial hydrogelators,"Soft Matter, vol. 8, no. 23, pp. 6198-6205, 2012.

[14] L. L. Josephson, E. M. Furst, and W. J. Galush, "Particle tracking microrheology of protein solutions," Journal of Rheology, vol. 60, no. 4, pp. 531-540, 2016.

[15] M. T. Valentine, P. D. Kaplan, D. Thota, J. C. Crocker, T. Gisler, R. K. PrudâĂŹhomme, M. Beck, and D. A. Weitz, "Investigating the microenvironments of inhomogeneous soft materials with multiple particle tracking," Physical Review E, vol. 64, no. 6, p. 061506, 2001.

[16] S. K. Lai, Y.-Y. Wang, K. Hida, R. Cone, and J. Hanes, "Nanoparticles reveal that human cervicovaginal mucus is riddled with pores larger than viruses," Proceedings of the National Academy of Sciences, vol. 107, no. 2, pp. 598-603, 2010.

[17] S. K. Lai, Y.-Y. Wang, D. Wirtz, and J. Hanes, "Micro and macrorheology of mucus," Advanced drug delivery reviews, vol. 61, no. 2, pp. 86-100, 2009.

[18] J. C. Crocker and D. G. Grier, "Methods of digital video microscopy for colloidal studies," Journal of colloid and interface science, vol. 179, no. 1, pp. 298-310, 1996.

[19] N. Chenouard, I. Smal, F. De Chaumont, M. Maška, I. F. Sbalzarini, Y. Gong, J. Cardinale, C. Carthel, S. Coraluppi, M. Winter et al., "Objective comparison of particle tracking methods," Nature methods, vol. 11, no. 3, p. 281, 2014.

[20] A. Krizhevsky, I. Sutskever, and G. E. Hinton, "Imagenet classification with deep convolutional neural networks," in Advances in neural information processing systems, 2012, pp. 1097-1104.

[21] J. Long, E. Shelhamer, and T. Darrell, "Fully convolutional networks for semantic segmentation," in Proceedings of the IEEE Conference on Computer Vision and Pattern Recognition, 2015, pp. 3431-3440.

[22] T. Savin and P. S. Doyle, "Static and dynamic errors in particle tracking microrheology," Biophysical journal, vol. 88, no. 1, pp. 623-638, 2005.

[23] X. Glorot, A. Bordes, and Y. Bengio, "Deep sparse rectifier neural networks." in Aistats, vol. 15, no. 106, 2011, p. 275.

[24] R. Lumia, "A new three-dimensional connected components algorithm," Computer Vision, Graphics, and Image Processing, vol. 23, no. 2, pp. 207-217, 1983.

[25] R. Parthasarathy, "Rapid, accurate particle tracking by calculation of radial symmetry centers," Nature Methods, vol. 9, no. 7, pp. 724-726, 2012.

[26] K. Jaqaman, D. Loerke, M. Mettlen, H. Kuwata, S. Grinstein, S. L. Schmid, and G. Danuser, "Robust single-particle tracking in live-cell time-lapse sequences," Nature methods, vol. 5, no. 8, pp. 695-702, 2008.

[27] X. Xiao, V. F. Geyer, H. Bowne-Anderson, J. Howard, and I. F. Sbalzarini, "Automatic optimal filament segmentation with sub-pixel accuracy using generalized linear models and b-spline level-sets," Medical image analysis, vol. 32, pp. 157-172, 2016.

[28] J.-C. Olivo-Marin, "Extraction of spots in biological images using multiscale products," Pattern recognition, vol. 35, no. 9, pp. 1989-1996, 2002.

[29] N. Chenouard, I. Bloch, and J.-C. Olivo-Marin, "Multiple hypothesis tracking for cluttered biological image sequences," IEEE transactions on pattern analysis and machine intelligence, vol. 35, no. 11, pp. 2736-3750, 2013.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for using a synthetically trained neural network for tracking particle movement in video microscopy data, the method comprising:
   receiving, as input, video microscopy data representing images of particles that move between video frames;
   using a synthetically trained neural network to track movement of the particles between the video frames, wherein the synthetically trained neural network comprises a neural network that is trained on a plurality of different simulated video microscopy data sets, wherein the simulated video microscopy data sets are configured to simulate plural different video microscopy imaging and experimental conditions, wherein the different video microscopy imaging and experimental conditions include randomized video microscopy imaging and experimental conditions, wherein the randomized video microscopy imaging and experimental conditions include noise with random intensity and random background patterns; and outputting, by the synthetically trained neural network, an indication of movement of the particles between the video frames.

2. The method of claim 1 wherein the randomized video microscopy imaging and experimental conditions further include a randomized point spread function (PSF) of simulated particles.

3. The method of claim 1 wherein the synthetically trained neural network comprises a convolutional neural network.

4. The method of claim 1 wherein tracking movement of the particles includes tracking movement of the particles in at least one of x, y, and z directions with respect to a focal plane of a microscope through which the video microscopy data is collected.

5. The method of claim 1 wherein the synthetically trained neural network resides in a cloud network, and wherein receiving, as input, the video microscopy data includes receiving the video microscopy data from an on premise network separate from the cloud network and wherein outputting the indication of movement of the particles includes outputting the indication of movement from the cloud network to the on premise network.

6. The method of claim 1 wherein the synthetically trained neural network resides in an on premise network of a user to analyze video microscopy data generated by the user.

7. A system for using a synthetically trained neural network for tracking particle movement in video microscopy data, the system comprising:

a computing platform including at least one processor;

a synthetically trained neural network, executable by the at least one processor, configured to perform the steps of receiving, as input, video microscopy data representing images of particles that move between video frames, tracking movement of the particles between the video frames, wherein the synthetically trained neural network comprises a neural network that is trained on a plurality of different simulated video microscopy data sets, and outputting, an indication of movement of the particles between the video frames, wherein the simulated video microscopy data sets are configured to simulate plural different video microscopy imaging and experimental conditions, wherein the different video microscopy imaging and experimental conditions include randomized video microscopy imaging and experimental conditions, wherein the randomized video microscopy imaging and experimental conditions include noise with random intensity and random background patterns.

8. The system of claim 7 wherein the randomized video microscopy imaging and experimental conditions further include a randomized point spread function (PSF) of simulated particles.

9. The system of claim 7 wherein the synthetically trained neural network comprises a convolutional neural network.

10. The system of claim 7 wherein tracking movement of the particles includes tracking movement of the particles in at least one of x, y, and z directions with respect to a focal plane of a microscope through which the video microscopy data is collected.

11. The system of claim 7 wherein the synthetically trained neural network resides in a cloud network, and wherein receiving, as input, the video microscopy data includes receiving the video microscopy data from an on premise network separate from the cloud network and wherein outputting the indication of movement of the particles includes outputting the indication of movement from the cloud network to the on premise network.

12. The system of claim 7 wherein the synthetically trained neural network resides in an on premise network of a user to analyze video microscopy data generated by the user.

13. A non-transitory computer readable medium having stored thereon executable instructions that when executed by a processor of a computer control the computer to perform steps comprising:

receiving, as input, video microscopy data representing images of particles that move between video frames;

using a synthetically trained neural network to track movement of the particles between the video frames, wherein the synthetically trained neural network comprises a neural network that is trained on a plurality of different simulated video microscopy data sets; and outputting, by the synthetically trained neural network, an indication of movement of the particles between the video frames, wherein the simulated video microscopy data sets are configured to simulate plural different video microscopy imaging and experimental conditions, wherein the different video microscopy imaging and experimental conditions include randomized video microscopy imaging and experimental conditions, wherein the randomized video microscopy imaging and experimental conditions include noise with random intensity and random background patterns.

* * * * *